United States Patent
Ejiri

(10) Patent No.: US 12,262,129 B2
(45) Date of Patent: Mar. 25, 2025

(54) SOLID-STATE IMAGING DEVICE AND ELECTRONIC APPARATUS INCLUDING TWO FLOATING DIFFUSION REGIONS

(71) Applicant: SONY SEMICONDUCTOR SOLUTIONS CORPORATION, Kanagawa (JP)

(72) Inventor: Hirokazu Ejiri, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 324 days.

(21) Appl. No.: 17/291,316

(22) PCT Filed: Oct. 29, 2019

(86) PCT No.: PCT/JP2019/042356
§ 371 (c)(1),
(2) Date: May 5, 2021

(87) PCT Pub. No.: WO2020/100577
PCT Pub. Date: May 22, 2020

(65) Prior Publication Data
US 2022/0077207 A1    Mar. 10, 2022

(30) Foreign Application Priority Data

Nov. 13, 2018 (JP) ................................ 2018-213147

(51) Int. Cl.
*H04N 25/59* (2023.01)
*H01L 27/146* (2006.01)
(Continued)

(52) U.S. Cl.
CPC ....... *H04N 25/59* (2023.01); *H01L 27/14612* (2013.01); *H01L 27/14636* (2013.01);
(Continued)

(58) Field of Classification Search
None
See application file for complete search history.

(56) References Cited

U.S. PATENT DOCUMENTS 8,773,562 B1    7/2014  Fan
9,888,197 B1 *  2/2018  Hynecek ............. H04N 25/531
(Continued)

FOREIGN PATENT DOCUMENTS

CN    103745983 A    4/2014
CN    105742303 A    7/2016
(Continued)

OTHER PUBLICATIONS

International Search Report prepared by the Japan Patent Office on Jan. 15, 2020, for International Application No. PCT/JP2019/042356.

*Primary Examiner* — Quan Pham
(74) *Attorney, Agent, or Firm* — SHERIDAN ROSS P.C.

(57) ABSTRACT

A solid-state imaging device according to an embodiment of the present disclosure includes a mode-switching switch section that, in a first mode, electrically couples a first signal path to a photoelectric conversion section and electrically decouples a second signal path from the photoelectric conversion section, and that, in a second mode, electrically couples both of the first signal path and the second signal path to the photoelectric conversion section. At least the photoelectric conversion section is formed in a first substrate, and at least a second amplification transistor is formed in a second substrate, among the first substrate and the second substrate stacked on each other.

20 Claims, 34 Drawing Sheets

(51) Int. Cl.
*H01L 27/148* (2006.01)
*H04N 25/75* (2023.01)
*H04N 25/772* (2023.01)
*H04N 25/79* (2023.01)

(52) U.S. Cl.
CPC .. *H01L 27/14643* (2013.01); *H01L 27/14831* (2013.01); *H04N 25/75* (2023.01); *H04N 25/772* (2023.01); *H04N 25/79* (2023.01)

(56) References Cited

U.S. PATENT DOCUMENTS

| | | | |
|---|---|---|---|
| 2009/0190017 A1* | 7/2009 | Ono | H04N 25/63 348/308 |
| 2013/0092820 A1 | 4/2013 | Takemoto | |
| 2013/0207219 A1* | 8/2013 | Ahn | H01L 27/14634 257/443 |
| 2014/0151754 A1* | 6/2014 | Arakawa | H01L 27/14623 438/57 |
| 2016/0134824 A1 | 5/2016 | Gomi et al. | |
| 2016/0233263 A1 | 8/2016 | Okada | |
| 2017/0347047 A1* | 11/2017 | Mao | H01L 27/14641 |
| 2018/0007294 A1 | 1/2018 | Eshel | |
| 2018/0205896 A1* | 7/2018 | Nishimura | H04N 25/573 |
| 2020/0154066 A1* | 5/2020 | Johnson | H04N 25/75 |

FOREIGN PATENT DOCUMENTS

| | | |
|---|---|---|
| JP | 2001-339057 | 12/2001 |
| JP | 2003-134396 | 5/2003 |
| JP | 2007-150361 | 6/2007 |
| JP | 2007-228460 | 9/2007 |
| JP | 2012-248952 | 12/2012 |
| JP | 2013-009301 | 1/2013 |
| JP | 2013017124 A | 1/2013 |
| JP | 2013-090127 | 5/2013 |
| JP | 2016-149387 | 8/2016 |
| KR | 20060028429 A | 3/2006 |
| WO | WO-2017161060 A1 | 9/2017 |

* cited by examiner

SOLID-STATE IMAGING DEVICE AND ELECTRONIC APPARATUS INCLUDING TWO FLOATING DIFFUSION REGIONS

CROSS REFERENCE TO RELATED APPLICATIONS

This application is a national stage application under 35 U.S.C. 371 and claims the benefit of PCT Application No. PCT/JP2019/042356 having an international filing date of 29 Oct. 2019, which designated the United States, which PCT application claimed the benefit of Japanese Patent Application No. 2018-213147, filed 13 Nov. 2018, the entire disclosures of each of which are incorporated herein by reference.

TECHNICAL FIELD

The present disclosure relates to a solid-state imaging device and an electronic apparatus.

BACKGROUND ART

The solid-state imaging device has been used for, for example, an imaging apparatus such as a digital still camera or a video camera, or an electronic apparatus such as a portable terminal apparatus having an imaging function. Examples of the solid-state imaging device include a CMOS (complementary MOS) image sensor that reads charges accumulated in a photodiode, which is a photoelectric conversion element, via a MOS (Metal Oxide Semiconductor) transistor.

The CMOS image sensor has desirably high sensitivity to enable an imaging signal to be acquired even during low illuminance. In addition, in order to enlarge a dynamic range, it is desirable that a photodiode be less likely to be saturated. However, there is a trade-off relationship between the high sensitivity and the photodiode being less likely to be saturated, and thus it is difficult to expand the dynamic range while maintaining the high sensitivity. Therefore, for example, PTL 1 discloses that a floating diffusion with small capacity and a floating diffusion with large capacity are provided and that the floating diffusion with small capacity is coupled to a photodiode during low illuminance, whereas the floating diffusion with large capacity is coupled during high illuminance.

CITATION LIST

Patent Literature

PTL 1: Japanese Unexamined Patent Application Publication No. 2003-134396

SUMMARY OF THE INVENTION

However, in a case where the invention described in PTL 1 is applied to a high-definition use application, there is an issue of difficulty in securing an enough space to provide two floating diffusions. It is therefore desirable to provide a solid-state imaging device that makes it possible to achieve both high sensitivity and a high dynamic range even in a high-definition use application, and an electronic apparatus including the solid-state imaging device.

A solid-state imaging device according to a first aspect of the present disclosure includes a photoelectric conversion section, a first signal path including a first floating diffusion and a first amplification transistor, and a second signal path including a second floating diffusion and a second amplification transistor. The solid-state imaging device further includes a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section. The solid-state imaging device further includes a first substrate and a second substrate. In the first substrate, at least the photoelectric conversion section is formed, among the photoelectric conversion section, the first floating diffusion, the first amplification transistor, the second floating diffusion, the second amplification transistor, and the mode-switching switch section. The second substrate is stacked on the first substrate. In the second substrate, at least the second amplification transistor is formed, among the photoelectric conversion section, the first floating diffusion, the first amplification transistor, the second floating diffusion, the second amplification transistor, and the mode-switching switch section.

An electronic apparatus according to the first aspect of the present disclosure includes a solid-state imaging device that outputs a pixel signal corresponding to incident light, and a signal processing circuit that processes the pixel signal. The solid-state imaging device provided in the electronic apparatus has configurations similar to those of the solid-state imaging device according to the first aspect of the present disclosure.

A solid-state imaging device according to a second aspect of the present disclosure includes a photoelectric conversion section, a first signal path including a first floating diffusion and a first amplification transistor, and a second signal path including a second floating diffusion and a second amplification transistor. The solid-state imaging device further includes a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section. The solid-state imaging device further includes a first substrate, a second substrate, and a third substrate. In the first substrate, the photoelectric conversion section and the first floating diffusion are formed. The second substrate is stacked on the first substrate. In the second substrate, the first amplification transistor, the second floating diffusion, and the mode-switching switch section are formed. The third substrate is stacked on the second substrate. In the third substrate, the second amplification transistor is formed.

An electronic apparatus according to the second aspect of the present disclosure includes a solid-state imaging device that outputs a pixel signal corresponding to incident light, and a signal processing circuit that processes the pixel signal. The solid-state imaging device provided in the electronic apparatus has configurations similar to those of the solid-state imaging device according to the second aspect of the present disclosure.

In the solid-state imaging device and the electronic apparatus according to the first aspect of the present disclosure as well as the solid-state imaging device and the electronic apparatus according to the second aspect of the present disclosure, an amplification transistor to be used is selected depending on the mode. This makes it possible to expand a dynamic range while maintaining high sensitivity. In addition, in the solid-state imaging device and the electronic apparatus according to the first aspect of the present disclosure as well as the solid-state imaging device and the electronic apparatus according to the second aspect of the present disclosure, at least the amplification transistor is formed in a substrate different from a substrate in which the photoelectric conversion section is formed. This enables even a high-definition solid-state imaging device to secure an enough space to provide the floating diffusion and the amplification transistor.

BRIEF DESCRIPTION OF THE DRAWINGS

FIG. 35 is a diagram of assistance in explaining an example of installation positions of an outside-vehicle information detecting section and an imaging section.

MODES FOR CARRYING OUT THE
INVENTION

Figure 3:
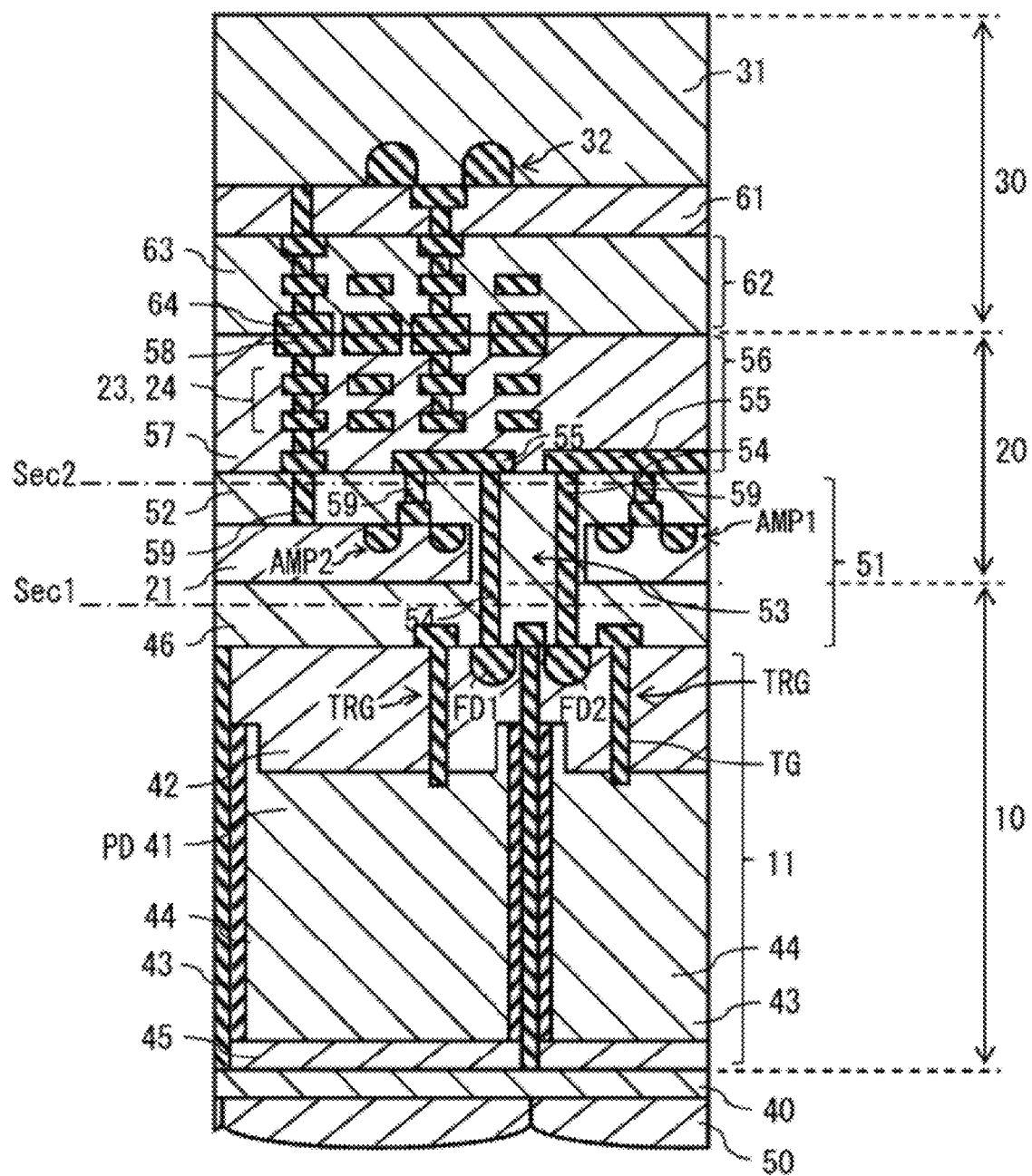
FIG. 3 illustrates an example of a cross-sectional configuration in a vertical direction of the solid-state imaging device of FIG. 1.
Figure 4:
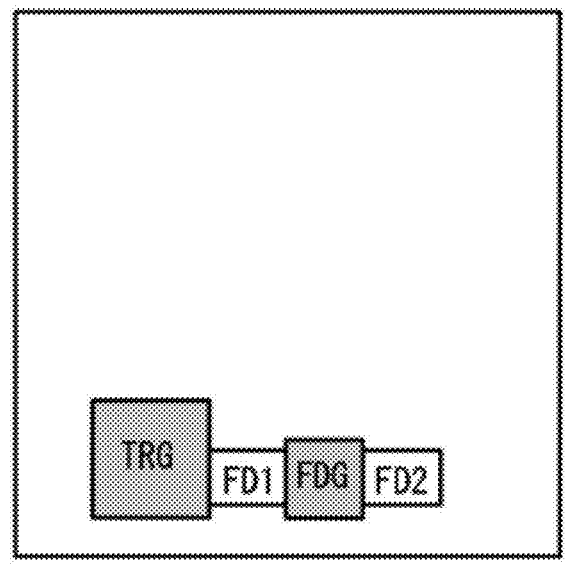
FIG. 4 illustrates an example of a cross-sectional configuration in a horizontal direction of the solid-state imaging device of FIG. 1.
Figure 32:
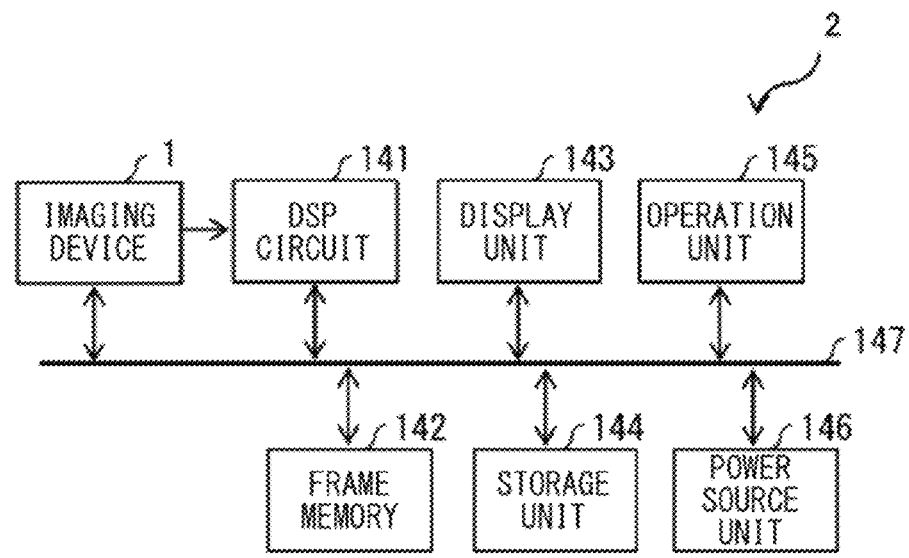
FIG. 32 illustrates an example of a schematic configuration of an imaging system including any of the solid-state imaging devices according to the foregoing embodiment and modification examples thereof.
Figure 33:
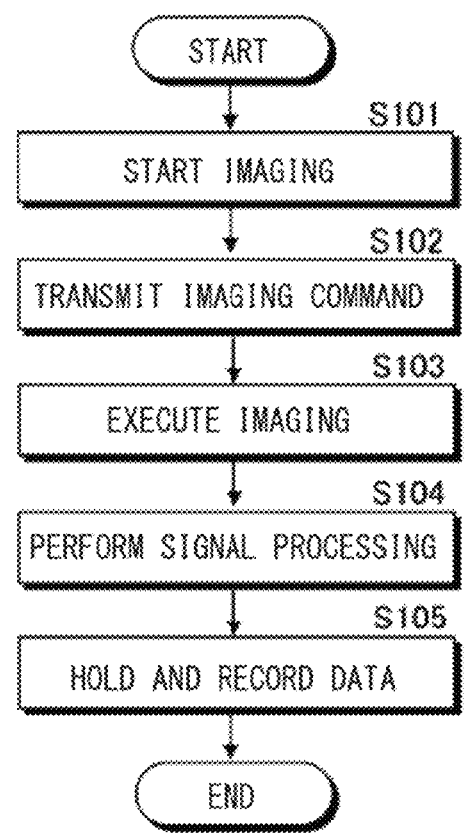
FIG. 33 illustrates an example of an imaging procedure in the imaging system of FIG. 32.
Figure 34:
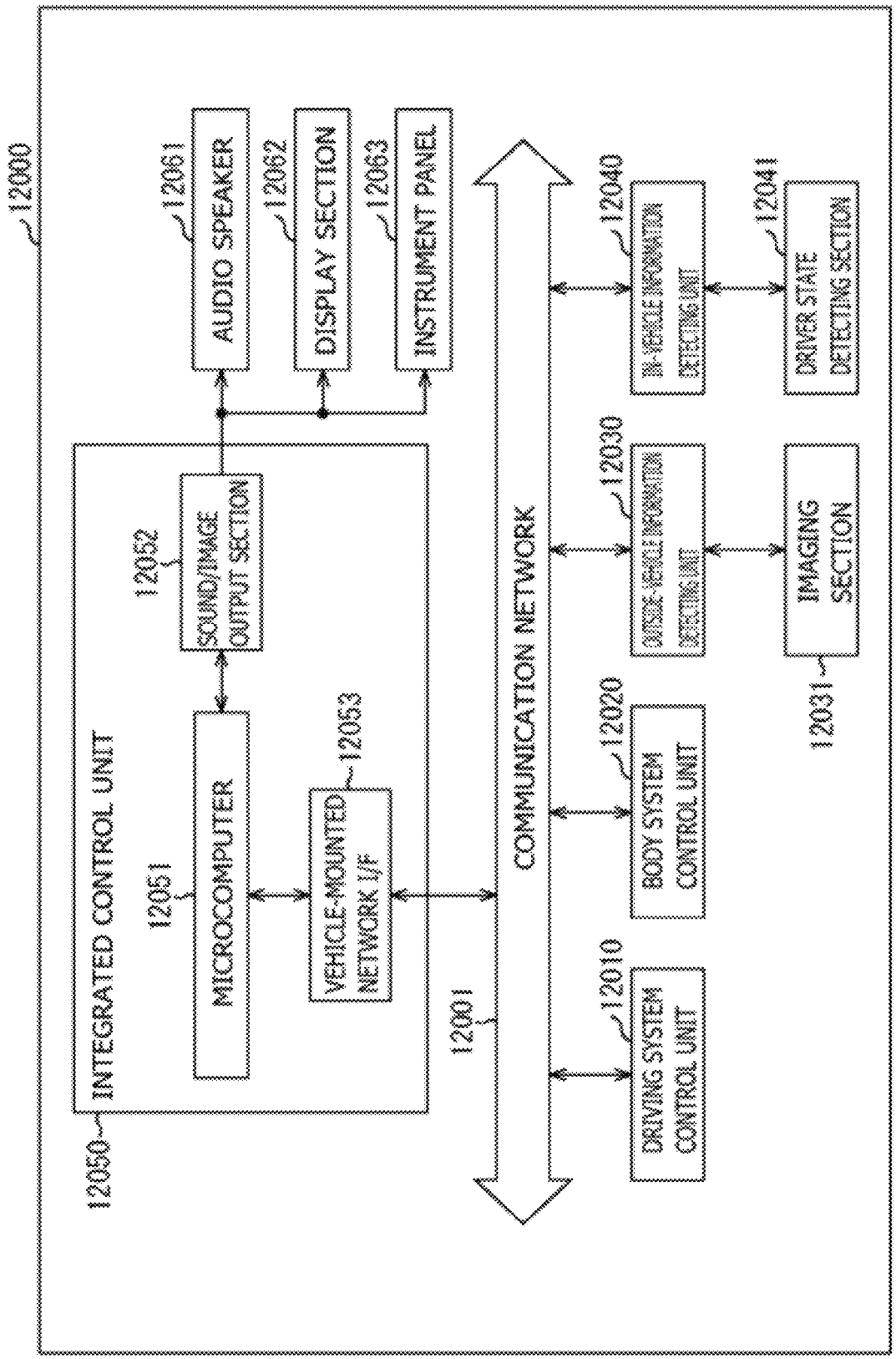
FIG. 34 is a block diagram depicting an example of schematic configuration of a vehicle control system.
Figure 36:
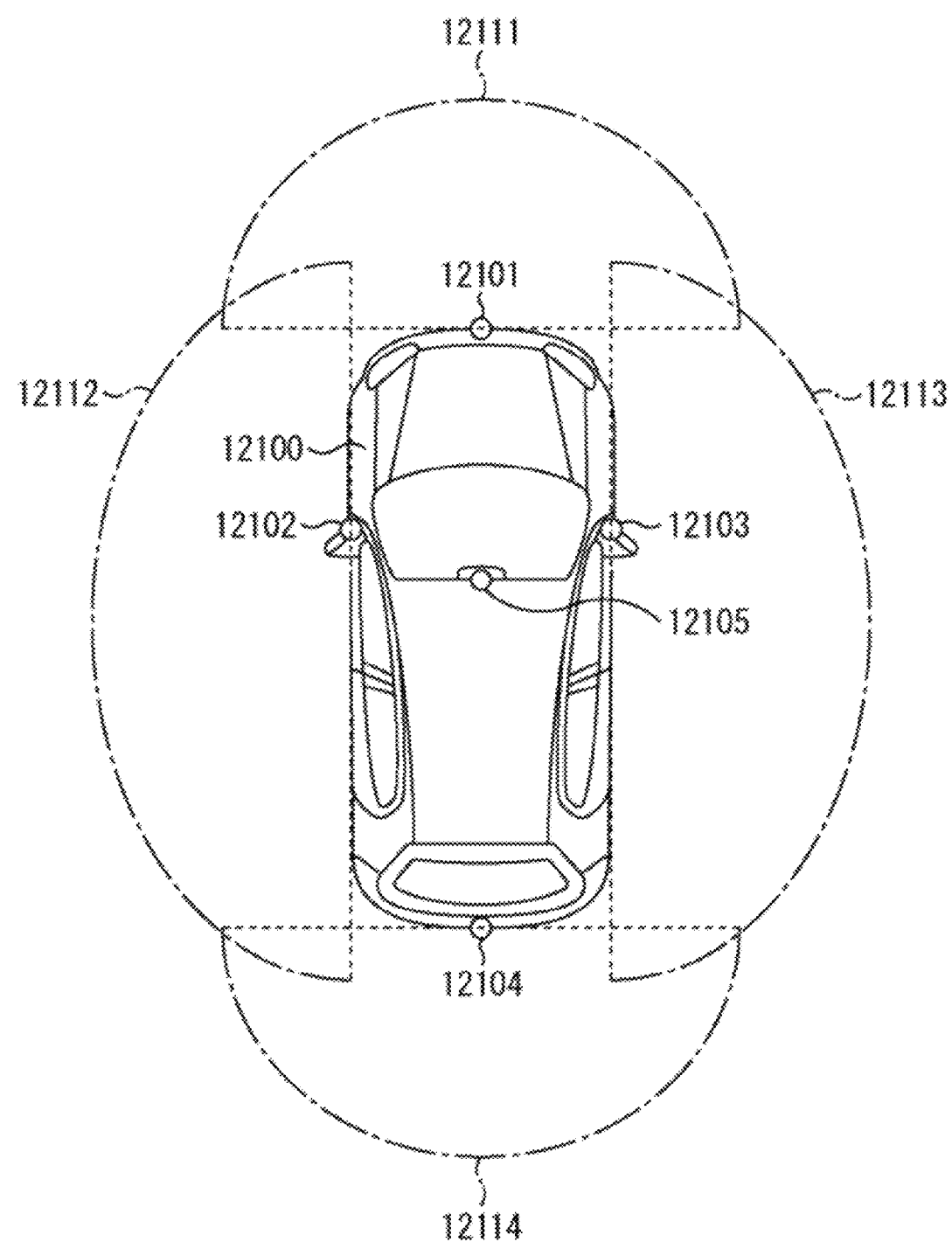
FIG. 36 is a view depicting an example of a schematic configuration of an endoscopic surgery system.
Figure 36:
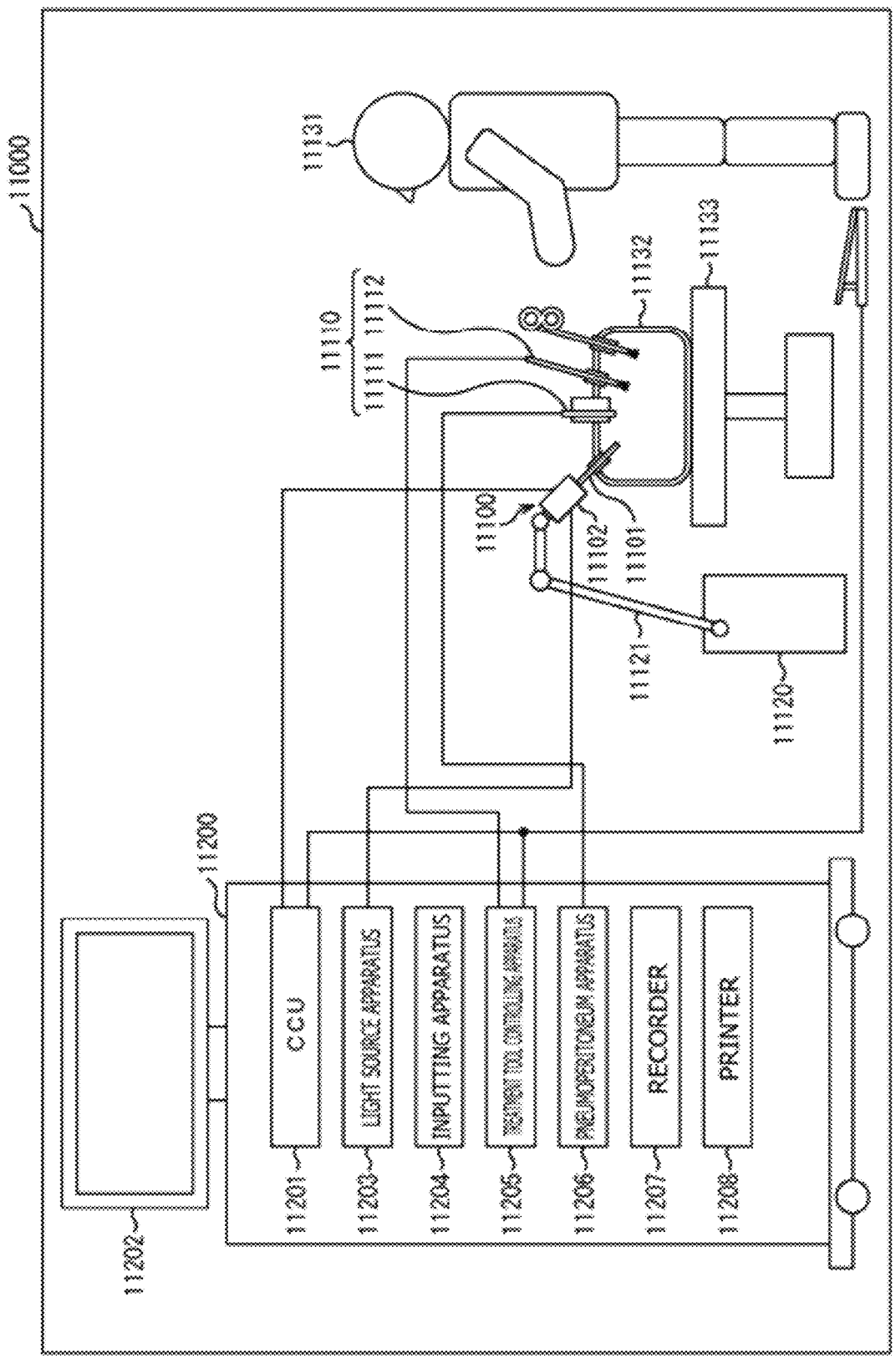
Figure 37:
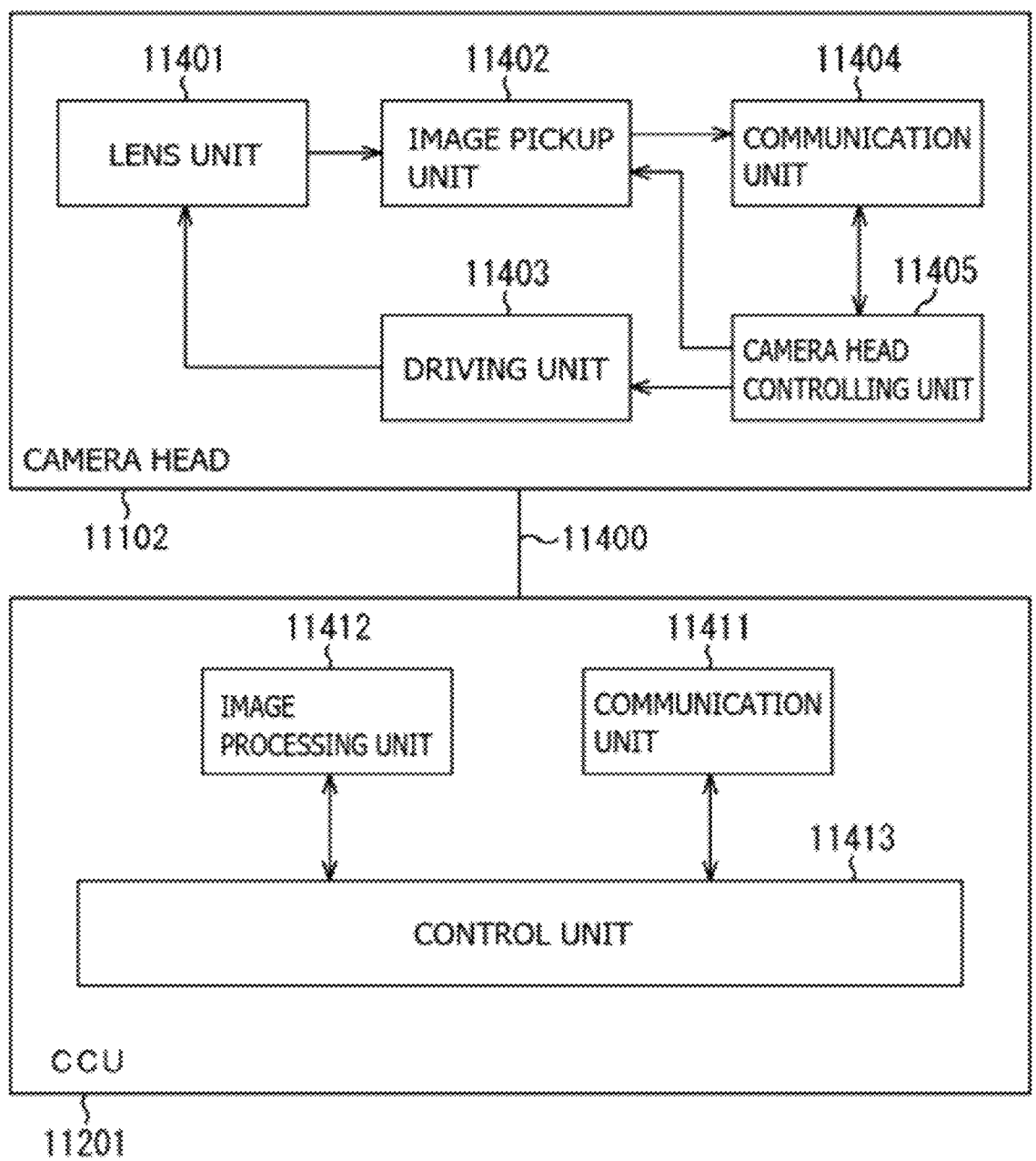
FIG. 37 is a block diagram depicting an example of a functional configuration of a camera head and a camera control unit (CCU).

Hereinafter, description is given in detail of embodiments of the present disclosure with reference to the drawings. It is to be noted that description is given in the following order.
1. Embodiment (Solid-State Imaging Device) . . . FIGS. 1 to 8G
2. Modification Examples (Solid-State Imaging Device) . . . FIGS. 9 to 31
3. Application Example (Imaging System) . . . FIGS. 32 and 33
4. Examples of Practical Applications
   Example of Practical Application to Mobile Body . . . FIGS. 34 and 35
   Example of Practical Application to Endoscopic Surgery System . . . FIGS. 36 and 37

1. Embodiment

[Configuration]

Description is given of a solid-state imaging device 1 according to an embodiment of the present disclosure. The solid-state imaging device 1 is, for example, a backside illumination type image sensor including a CMOS (Complementary Metal Oxide Semiconductor) image sensor, or the like. The solid-state imaging device 1 receives light from a subject and performs photoelectric conversion to generate an image signal, thereby capturing an image. The solid-state imaging device 1 outputs a pixel signal corresponding to incident light.

The backside illumination type image sensor refers to an image sensor of a configuration in which a photoelectric conversion section such as a photodiode that receives light from a subject and converts the received light into an electric signal is provided between a light-receiving surface on which light from the subject is incident and a wiring layer in which a wiring line such as a transistor that drives each pixel is provided. It is to be noted that the present disclosure is not limited to the application to the CMOS image sensor.

Figure 1:
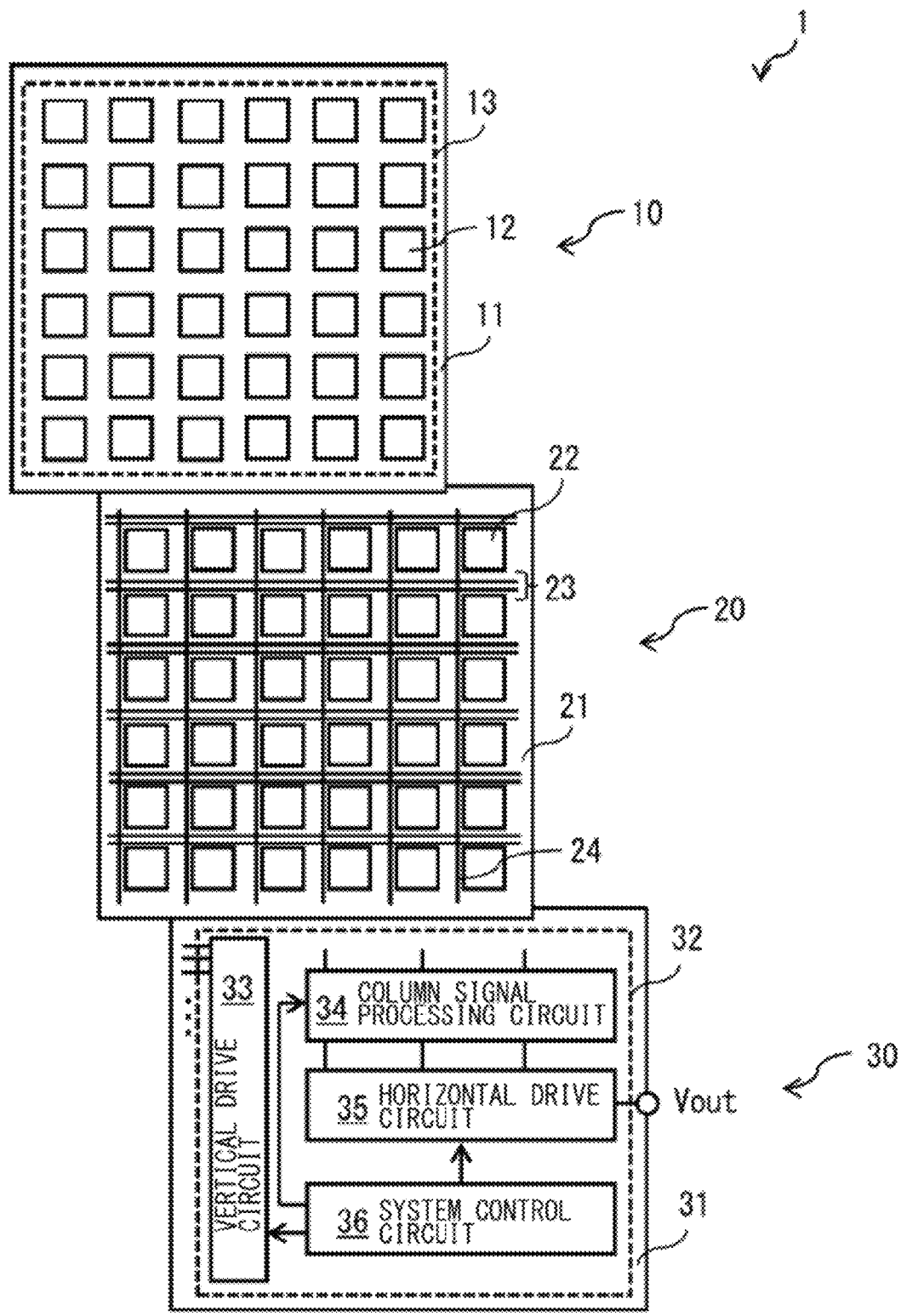
FIG. 1 illustrates an example of a schematic configuration of a solid-state imaging device according to an embodiment of the present disclosure.

FIG. 1 illustrates an example of a schematic configuration of the solid-state imaging device 1 according to an embodiment of the present disclosure. The solid-state imaging device 1 includes three substrates (a first substrate 10, a second substrate 20, and a third substrate 30). The solid-state imaging device 1 is a three-dimensionally structured imaging device in which the three substrates (the first substrate 10, the second substrate 20, and the third substrate 30) are attached together. The first substrate 10, the second substrate 20, and the third substrate 30 are stacked in this order.

The first substrate 10 includes a pixel region 13 in which a plurality of sensor pixels 12 that perform photoelectric conversion are arranged in matrix. The pixel region 13 is formed on a semiconductor substrate 11. The second substrate 20 includes a plurality of readout circuits 22 that output pixel signals based on charges outputted from the sensor pixels 12. The plurality of readout circuits 22 are formed on a semiconductor substrate 21, and are assigned one by one for the respective sensor pixels 12, for example. The second substrate 20 includes a plurality of pixel drive lines 23 extending in a row direction and a plurality of vertical signal lines 24 extending in a column direction. The third substrate 30 includes a logic circuit 32 that processes the pixel signal. The logic circuit 32 is formed on a semiconductor substrate 31. The logic circuit 32 includes, for example, a vertical drive circuit 33, a column signal processing circuit 34, a horizontal drive circuit 35, and a system control circuit 36. The logic circuit 32 (specifically, the horizontal drive circuit 35) outputs an output-voltage Vout for each sensor pixel 12 to the outside.

The vertical drive circuit 33 sequentially selects, for example, the plurality of sensor pixels 12 in a unit of row. The column signal processing circuit 34 performs, for example, correlated double sampling (Correlated Double Sampling: CDS) processing on a pixel signal outputted from each sensor pixel 12 of a row selected by the vertical drive circuit 33. The column signal processing circuit 34 performs, for example, the CDS processing to thereby extract a signal level of the pixel signal and to hold pixel data corresponding to an amount of light reception of each sensor pixel 12. The horizontal drive circuit 35 sequentially outputs, for example, the pixel data held in the column signal processing circuit 34 to the outside. The system control circuit 36 controls, for example, driving of each of the blocks (the vertical drive circuit 33, the column signal processing circuit 34, and the horizontal drive circuit 35) inside the logic circuit 32.

Figure 2:
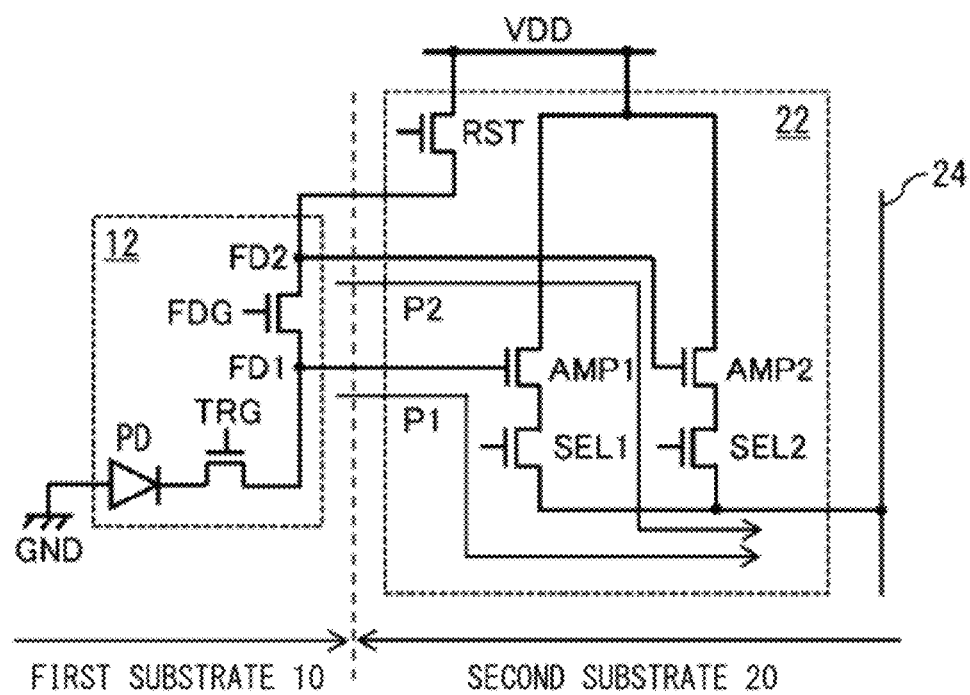
FIG. 2 illustrates an example of a sensor pixel and a readout circuit of FIG. 1.

FIG. 2 illustrates an example of a circuit configuration of the sensor pixel 12 and the readout circuit 22. Hereinafter, description is given of a case where one readout circuit 22 is assigned to one sensor pixel 12 as illustrated in FIG. 2.

Each sensor pixel 12 includes, for example, a photodiode PD, a transfer transistor TRG electrically coupled to the photodiode PD, and two floating diffusions FD1 and FD2 that temporarily hold charges outputted from the photodiode PD via the transfer transistor TRG. The photodiode PD corresponds to a specific example of a "photoelectric conversion section" of the present disclosure. The floating diffusion FD1 corresponds to a specific example of a "first floating diffusion" of the present disclosure. The floating diffusion FD2 corresponds to a specific example of a "second floating diffusion" of the present disclosure.

The photodiode PD performs photoelectric conversion to thereby generate charges corresponding to an amount of light reception. A cathode of the photodiode PD is electrically coupled to a source of the transfer transistor TRG, and an anode of the photodiode PD is electrically coupled to a reference potential line (e.g., a ground GND). A drain of the transfer transistor TRG is electrically coupled to the floating diffusion FD1, and a gate of the transfer transistor TRG is electrically coupled to the pixel drive line 23. The transfer transistor TR is, for example, an NMOS (Metal Oxide Semiconductor) transistor.

Each sensor pixel 12 further includes, for example, a switching transistor FDG that switches between the two floating diffusions FD1 and FD2. The switching transistor FDG corresponds to a specific example of a "mode-switching switch section" of the present disclosure. The switching transistor FDG is, for example, an NMOS transistor. A source of the switching transistor FDG is the floating diffusion FD1, and is electrically coupled to the drain of the transfer transistor TRG. A drain of the switching transistor FDG is the floating diffusion FD2, and is electrically coupled to a source of a reset transistor RST described later.

The readout circuit 22 includes, for example, the reset transistor RST, two amplification transistors AMP1 and AMP2, and two selection transistors SEL1 and SEL. The amplification transistor AMP1 corresponds to a specific example of a "first amplification transistor" of the present disclosure. The amplification transistor AMP2 corresponds to a specific example of a "second amplification transistor" of the present disclosure. The reset transistor RST, the amplification transistors AMP1 and AMP2, and the selection transistors SEL1 and SEL2 are each, for example, an NMOS transistor.

The source of the reset transistor RST (an input end of the readout circuit 22) is electrically coupled to the floating diffusion FD2, and a drain of the reset transistor RST is electrically coupled to a power source line VDD and a drain of each of the two amplification transistors AMP1 and AMP2. A gate of the reset transistor RST is electrically coupled to the pixel drive line 23 (see FIG. 1). A source of the amplification transistor AMP1 is electrically coupled to a drain of the selection transistor SEL1, and a gate of the amplification transistor AMP1 is electrically coupled to the floating diffusion FD1. A source of the selection transistor SEL1 (an output end of the readout circuit 22) is electrically coupled to the vertical signal line 24, and a gate of the selection transistor SEL1 is electrically coupled to the pixel drive line 23 (see FIG. 1). A source of the amplification transistor AMP2 is electrically coupled to a drain of the selection transistor SEL2, and a gate of the amplification transistor AMP2 is electrically coupled to the floating diffusion FD2. A source of the selection transistor SEL2 (an output end of the readout circuit 22) is electrically coupled to the vertical signal line 24, and a gate of the selection transistor SEL2 is electrically coupled to the pixel drive line 23 (see FIG. 1).

The readout circuit 22 is provided with a signal path P1 including the floating diffusion FD1 and the amplification transistor AMP1 and with a signal path P2 including the floating diffusion FD2 and the amplification transistor AMP2. The signal path P1 corresponds to a specific example of a "first signal path" of the present disclosure. The signal path P2 corresponds to a specific example of a "second signal path" of the present disclosure. One end of each of the signal paths P1 and P2 is electrically coupled to the vertical signal line 24, the other end of the signal path P1 is electrically coupled to the floating diffusion FD1, and the other end of the signal path P2 is electrically coupled to the floating diffusion FD2. Accordingly, the signal paths P1 and P2 are coupled in parallel with each other when the switching transistor FDG is ON. In addition, the signal path P1 is electrically coupled to the transfer transistor TRG, regardless of ON/OFF of the switching transistor FDG. Meanwhile, the signal path P2 is electrically coupled to the transfer transistor TRG when the switching transistor FDG is ON, but is electrically separated from the transfer transistor TRG when the switching transistor FDG is OFF. That is, when the switching transistor FDG is OFF, no current flows to the signal path P2.

When the transfer transistor TRG is brought into an ON state, the transfer transistor TRG transfers charges of the photodiode PD to the floating diffusion FD1 or the floating diffusion FD2. The gate (a transfer gate TG) of the transfer transistor TRG extends to penetrate a well layer 42 from a top surface of the semiconductor substrate 11 to such a depth as to reach a PD 41, for example, as illustrated in FIG. 3.

The reset transistor RST resets an electric potential of each of the floating diffusions FD1 and FD2 to a predetermined electric potential. When the reset transistor RST is brought into an ON state, the electric potential of each of the floating diffusions FD1 and FD2 is reset to an electric potential of the power source line VDD. The selection transistors SEL1 and SEL2 each control an output timing of the pixel signal from the readout circuit 22.

The amplification transistor AMP1 generates, as a pixel signal, a signal of a voltage corresponding to a level of charges held in the floating diffusion FD1. The amplification transistor AMP2 generates, as a pixel signal, a signal of a voltage corresponding to a level of charges held in the floating diffusion FD2. The amplification transistors AMP1 and AMP2 configure a source-follower type amplifier, and output a pixel signal of a voltage corresponding to a level of charges generated in the photodiode PD. When the selection transistor SEL1 is brought into an ON state, the amplification transistor AMP1 amplifies an electric potential of the floating diffusion FD1, and outputs a voltage corresponding to the electric potential to the column signal processing circuit 34 via the vertical signal line 24. When the selection transistor SEL2 is brought into an ON state, the amplification transistor AMP2 amplifies an electric potential of the floating diffusion FD2, and outputs a voltage corresponding to the electric potential to the column signal processing circuit 34 via the vertical signal line 24.

The switching transistor FDG is used when switching a conversion efficiency. In general, the pixel signal is small when shooting in a dark place. When performing charge-voltage conversion on a basis of Q=CV, larger capacity of the floating diffusion FD1 (FD capacity C) causes the value V to be smaller upon conversion to a voltage using the amplification transistor. Meanwhile, the pixel signal becomes large in a bright place; it is therefore not possible, for the floating diffusion FD1, to receive the charges of the photodiode PD unless the FD capacity C is large. Further, the FD capacity C needs to be large to allow the value V not to be too large (i.e., to be small) upon the conversion to a voltage using the amplification transistor. Taking these into account, when the switching transistor FDG is turned ON, a gate capacity for the switching transistor FDG is increased, thus causing the entire FD capacity C to be large. Meanwhile, when the switching transistor FDG is turned off, the entire FD capacity C becomes small. In this manner, performing ON/OFF switching of the switching transistor FDG enables the FD capacity C to be variable, thus making it possible to switch the conversion efficiency.

The switching transistor FDG switches the FD capacity C between the time of high-sensitivity low-illuminance mode (first mode) and the time of low-sensitivity high-illuminance mode (second mode). Specifically, the switching transistor FDG is brought into an OFF state to cause the FD capacity C to be relatively small in the first mode, whereas the switching transistor FDG is brought into an ON state to cause the FD capacity C to be relatively large in the second mode. The switching transistor FDG, the reset transistor RST, the amplification transistors AMP1 and AMP2, and the selection transistors SEL1 and SEL2 are each, for example, an NMOS transistor. Under the control of the vertical drive circuit 33, in the first mode, the switching transistor FDG electrically couples the signal path P1 to the photodiode PD and electrically decouples the signal path P2 from the photodiode PD, whereas, in the second mode, the switching transistor FDG electrically couples both of the signal path P1 and the signal path P2 to the photodiode PD. Specifically, the switching transistor FDG is brought into an OFF state in the first mode, and is brought into an ON state in the second mode.

FIG. 3 illustrates an example of a cross-sectional configuration of the solid-state imaging device 1 in a vertical direction. FIG. 3 exemplifies a cross-sectional configuration of a location, of the solid-state imaging device 1, facing the sensor pixel 12. The solid-state imaging device 1 has a configuration in which the first substrate 10, the second substrate 20, and the third substrate 30 are stacked in this order, and further includes a color filter 40 and a light-receiving lens 50 on side of a back surface of the first substrate 10. The color filter 40 and the light-receiving lens 50 are each provided one by one for each sensor pixel 12, for example. That is, the solid-state imaging device 1 is an imaging device on side of backside illumination.

The first substrate 10 has a configuration in which an insulating layer 46 is stacked on the semiconductor substrate 11. The first substrate 10 includes an insulating layer 46 as a portion of an interlayer insulating film 51. The insulating layer 46 is provided in a gap between the semiconductor substrate 11 and the semiconductor substrate 21. The semiconductor substrate 11 is configured by a silicon substrate. The semiconductor substrate 11 includes, for example, a p-well layer 42 in a portion of the top surface and in the vicinity thereof, and includes the PD 41 of an electric conductivity type different from that of the p-well layer 42 in another region (a region deeper than the p-well layer 42). The p-well layer 42 has an electric conductivity type of, for example, a p-type. The PD 41 has an electric conductivity type different from that of the p-well layer 42, and has an electric conductivity type of, for example, an n-type. The semiconductor substrate 11 includes, inside the p-well layer 42, the floating diffusions FD1 and FD2 of an electric conductivity type different from that of the p-well layer 42.

The first substrate 10 includes, for each sensor pixel 12, the photodiode PD, the transfer transistor TRG, the switching transistor FDG, and the floating diffusions FD1 and FD2. The first substrate 10 has a configuration in which the photodiode PD, the transfer transistor TR, the switching transistor FDG, and the floating diffusions FD1 and FD2 are provided on the top surface of the semiconductor substrate 11. The first substrate 10 includes an element separation section 43 that separates the sensor pixels 12 from each other. The element separation section 43 is formed to extend in a normal direction (thickness direction) of the semiconductor substrate 11. The element separation section 43 is provided between two sensor pixels 12 adjacent to each other. The element separation section 43 electrically separates the adjacent sensor pixels 12 from each other. The element separation section 43 is configured by, for example, silicon oxide. The element separation section 43 penetrates the semiconductor substrate 11, for example.

The first substrate 10 further includes, for example, a p-well layer 44, which is a side surface of the element separation section 43 and is in contact with a surface on side of the photodiode PD. The p-well layer 44 has an electric conductivity type different from that of the photodiode PD, and has an electric conductivity type of, for example, a p-type. The first substrate 10 further includes, for example, a fixed-charge film 45 in contact with a back surface of the semiconductor substrate 11. The fixed-charge film 45 includes negative fixed charges in order to suppress generation of a dark current due to an interface state of the semiconductor substrate 11 on side of a light-receiving surface. The fixed-charge film 45 is formed by, for example, an insulating film having negative fixed charges. Examples of a material of such an insulating film include hafnium oxide, zircon oxide, aluminum oxide, titanium oxide, and tantalum oxide. An electric field induced by the fixed-charge film 45 forms a hole accumulation layer at an interface of the semiconductor substrate 11 on the side of the light-receiving surface. This hole accumulation layer suppresses generation of electrons from the interface. The color filter 40 is provided on the side of the back surface of the semiconductor substrate 11. The color filter 40 is provided in contact with the fixed-charge film 45, for example, and is provided at a position opposed to the sensor pixel 12 with the fixed-charge film 45 interposed therebetween. The light-receiving lens 50 is provided in contact with the color filter 40, for example, and is provided at a position opposed to the sensor pixel 12 with the color filter 40 and the fixed-charge film 45 interposed therebetween.

The second substrate 20 has a configuration in which an insulating layer 52 is stacked on the semiconductor substrate 21. The second substrate 20 includes the insulating layer 52 as a portion of the interlayer insulating film 51. The insulating layer 52 is provided in a gap between the semiconductor substrate 21 and the semiconductor substrate 31. The semiconductor substrate 21 is configured by a silicon substrate. The second substrate 20 includes, for example, one readout circuit 22 for one sensor pixel 12. The second substrate 20 has a configuration in which the readout circuit 22 is provided on a top surface of the semiconductor substrate 21. The second substrate 20 is attached to the first substrate 10, with a back surface of the semiconductor substrate 21 being opposed to side of the top surface of the semiconductor substrate 11. That is, the second substrate 20 is attached to the first substrate 10 in a face-to-back manner. The second substrate 20 further includes an insulating layer 53 that penetrates the semiconductor substrate 21, in the same layers as the semiconductor substrate 21. The second substrate 20 includes the insulating layer 53 as a portion of the interlayer insulating film 51. The insulating layer 53 is provided to cover the side surface of a through-wiring line 54 described later.

A stacked body including the first substrate 10 and the second substrate 20 includes the interlayer insulating film 51 and a plurality of through-wiring lines 54 provided inside the interlayer insulating film 51. The plurality of through-wiring lines 54 extend in a normal direction of the semiconductor substrate 21, and is provided to penetrate a location, of the interlayer insulating film 51, including the insulating layer 53. The first substrate 10 and the second substrate 20 are electrically coupled to each other by the plurality of through-wiring lines 54. For example, two through-wiring lines 54 are electrically coupled to the floating diffusions FD1 and FD2 and a coupling wiring line 55 described later.

The second substrate 20 includes, for example, inside the insulating layer 52, a plurality of coupling sections 59 electrically coupled to the readout circuit 22 and the semiconductor substrate 21. The second substrate 20 further includes, for example, a wiring layer 56 on the insulating layer 52. The wiring layer 56 includes, for example, an insulating layer 57, and the plurality of pixel drive lines 23 and the plurality of vertical signal lines 24 provided inside the insulating layer 57. The wiring layer 56 further includes, for example, a plurality of coupling wiring lines 55 inside the insulating layer 57. The plurality of coupling wiring lines 55 is electrically coupled to each of the through-wiring lines 54 electrically coupled to the floating diffusions FD1 and FD2 and to the readout circuit 22. For example, the floating diffusion FD1 and the gate of the amplification transistor AMP1 are electrically coupled to each other by the coupling wiring line 55 and the through-wiring line 54. In addition, for example, the floating diffusion FD2 and the gate of the amplification transistor AMP2 are electrically coupled to each other by the coupling wiring line 55 and the through-wiring line 54.

The wiring layer 56 further includes, for example, a plurality of pad electrodes 58 inside the insulating layer 57. Each of the pad electrodes 58 is formed by Cu (copper), for example. Each of the pad electrodes 58 is exposed to a top surface of the wiring layer 56. Each of the pad electrodes 58 is used for electric coupling between the second substrate 20 and the third substrate 30 as well as for attaching the second substrate 20 and the third substrate 30 together. The plurality of pad electrodes 58 are provided one by one for the respective pixel drive lines 23 and the respective vertical signal lines 24, for example.

The third substrate 30 has a configuration in which an interlayer insulating film 61 is stacked on the semiconductor substrate 31, for example. The third substrate 30 is attached to the second substrate 20 in a face-to-face manner. Therefore, in describing the configurations inside the third substrate 30, a vertical relationship to be described is opposite to the vertical direction in the drawing. The semiconductor substrate 31 is configured by a silicon substrate. The third substrate 30 has a configuration in which the logic circuit 32 is provided on a top surface of the semiconductor substrate 31. The third substrate 30 further includes, for example, a wiring layer 62 on the interlayer insulating film 61. The wiring layer 62 includes, for example, an insulating layer 63 and a plurality of pad electrodes 64 provided inside the insulating layer 63. The plurality of pad electrodes 64 is electrically coupled to the logic circuit 32. Each of the pad electrodes 64 is formed by Cu (copper), for example. Each of the pad electrodes 64 is exposed to a top surface of the wiring layer 62. Each of the pad electrodes 64 is used for electric coupling between the second substrate 20 and the third substrate 30 as well as for attaching the second substrate 20 and the third substrate 30 together. The second substrate 20 and the third substrate 30 are electrically coupled to each other by bonding between the pad electrodes 58 and 64. That is, the gate of the transfer transistor TRG (transfer gate TG) is electrically coupled to the logic circuit 32 via the through-wiring line 54, the coupling wiring line 55, the coupling section 59, and the pad electrodes 58 and 64, for example. The third substrate 30 is attached to the second substrate 20, with the top surface of the semiconductor substrate 31 being opposed to side of the top surface of the semiconductor substrate 21. That is, the third substrate 30 is attached to the second substrate 20 in a face-to-face manner.

The first substrate 10 and the second substrate 20 are electrically coupled to each other by the through-wiring line 54. In addition, the second substrate 20 and the third substrate 30 are electrically coupled to each other by bonding between the pad electrodes 58 and 64. Here, the through-wiring line 54 has a width that is narrower than a width of a bonded part between the pad electrodes 58 and 64. That is, the through-wiring line 54 has a cross-sectional area that is smaller than a cross-sectional area of the bonded part between the pad electrodes 58 and 64. Accordingly, the through-wiring line 54 does not interfere with higher integration of the sensor pixels 12 inside the first substrate 10. In addition, the readout circuit 22 is formed in the second substrate 20, and the logic circuit 32 is formed in the third substrate 30, thus making it possible to form a structure for electrically coupling the second substrate 20 and the third substrate 30 to each other, to have a lower density than a structure for electrically coupling the first substrate 10 and the second substrate 20 to each other. Thus, it is possible to use the bonding between the pad electrodes 58 and 64, as a structure for electrically coupling the second substrate 20 and the third substrate 30 to each other.

Figure 5:
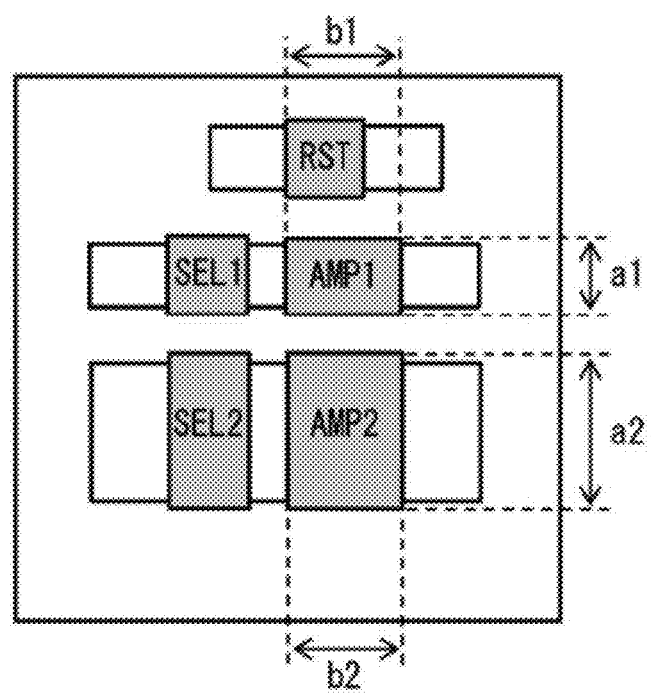
FIG. 5 illustrates an example of a cross-sectional configuration in the horizontal direction of the solid-state imaging device of FIG. 1.
Figure 6:
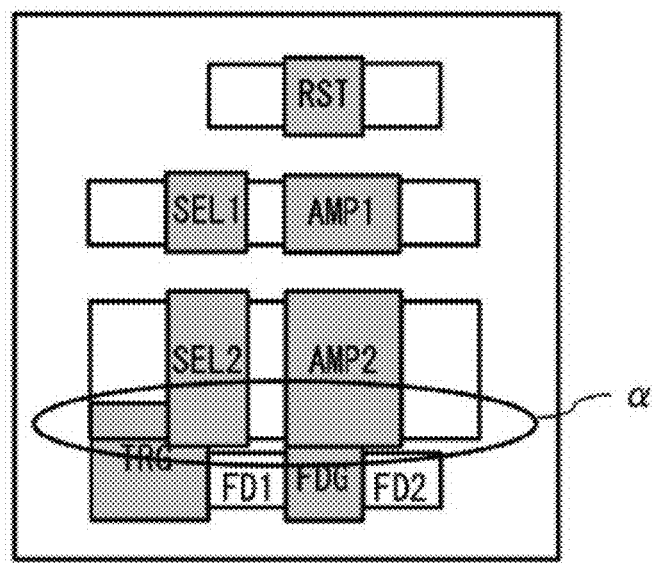
FIG. 6 illustrates an example of a configuration when superimposing the cross-sectional configuration of FIG. 4 and the cross-sectional configuration of FIG. 5 each other.

FIGS. 4 and 5 each illustrate an example of a cross-sectional configuration of the solid-state imaging device 1 in a horizontal direction. FIG. 4 illustrates an example of a top surface configuration of the semiconductor substrate 11, and FIG. 5 illustrates an example of a top surface configuration of the semiconductor substrate 21. FIG. 6 illustrates an example of a configuration in which the configuration illustrated in FIG. 4 and the configuration illustrated in FIG. 5 are superimposed on each other. The transfer transistor TRG, the switching transistor FDG, and the floating diffusions FD1 and FD2 are provided on the top surface of the semiconductor substrate 11. That is, the transfer transistor TRG, the switching transistor FDG, and the floating diffusions FD1 and FD2 are provided in the first substrate 10. Meanwhile, for example, the reset transistor RST, the amplification transistors AMP1 and AMP2, and the selection transistors SEL1 and SEL2 are provided on the top surface of the semiconductor substrate 21. That is, the reset transistor RST, the amplification transistors AMP1 and AMP2, and the selection transistors SEL1 and SEL2 are provided in the second substrate 20.

At this time, for example, as illustrated in FIG. 6, when the configuration illustrated in FIG. 4 and the configuration illustrated in FIG. 5 are superimposed on each other, an overlapping region α exists. It is appreciated, from the above, that, in the solid-state imaging device 1, as compared with a case where the transfer transistor TRG, the switching transistor FDG and the floating diffusions FD1 and FD2, the reset transistor RST, the amplification transistors AMP1 and AMP2, and the selection transistors SEL1 and SEL2 are provided in the substrate in common, the solid-state imaging device 1 is miniaturized by the overlapping region α.

Incidentally, L lengths b1 and b2 of the amplification transistors AMP1 and AMP2 are equal to each other, for example. Meanwhile, as for W lengths of the amplification transistors AMP1 and AMP2, for example, a W length a2 of the amplification transistor AMP2 is larger than a W length a1 of the amplification transistor AMP1. The W length a2 of the amplification transistor AMP2 is, for example, twice or three times as long as the W length a1 of the amplification transistor AMP1. When the switching transistor FDG is brought into an ON state, the W length of the amplification transistor as the readout circuit 22 is the sum of the W length a1 of the amplification transistor AMP1 and the W length a2 of the amplification transistor AMP2. Thus, performing ON/OF switching of the switching transistor FDG makes it possible, for example, to triple or quadruple the W length of the amplification transistor as the readout circuit 22.

Figure 7:
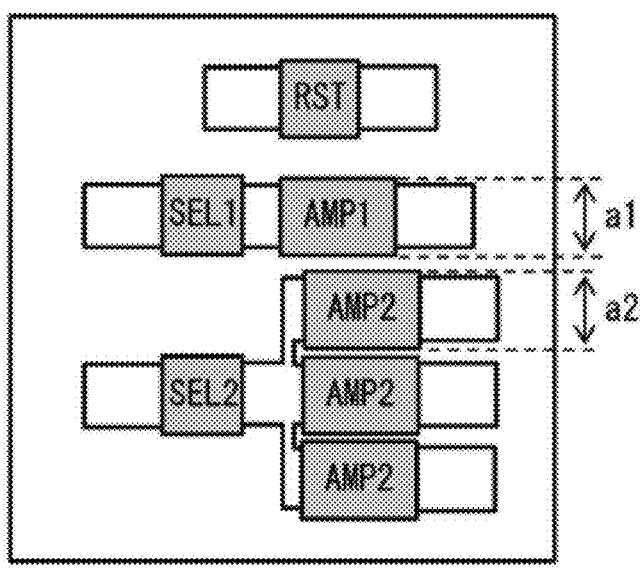
FIG. 7 illustrates a modification example of the cross-sectional configuration in the horizontal direction of the solid-state imaging device of FIG. 1.

It is to be noted that, as illustrated in FIG. 7, a plurality of amplification transistors AMP2 may be provided for the readout circuit 22. In this case, the W length a2 of each of the amplification transistors AMP2 may be equal to the W length a1 of the amplification transistor AMP1, or may be larger than the W length a1 of the amplification transistor AMP1.

[Manufacturing Method]

Next, description is given of a manufacturing method of the solid-state imaging device 1. FIGS. 8A to 8G each illustrate an example of a manufacturing process of the solid-state imaging device 1.

Figure 8A:
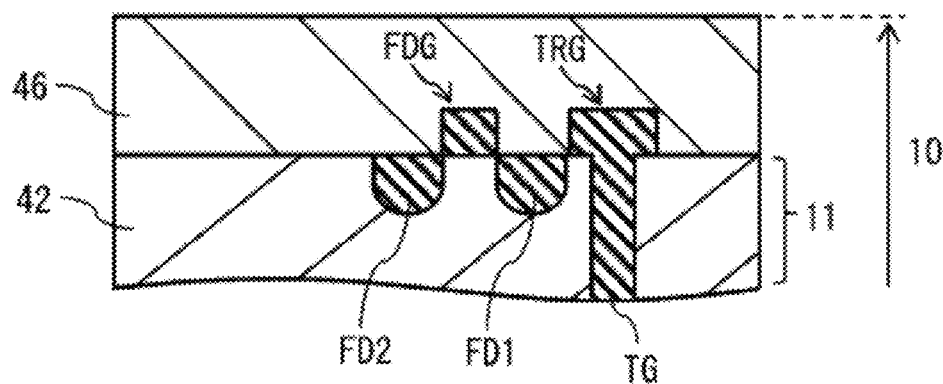
FIG. 8A illustrates an example of a manufacturing method of the solid-state imaging device of FIG. 1.

First, the p-well layer 42, the element separation section 43, and the p-well layer 44 are formed on the semiconductor substrate 11. Next, the photodiode PD, the transfer transistor TRG, the switching transistor FDG, and the floating diffusions FD1 and FD2 are formed on the semiconductor substrate 11 (FIG. 8A). This allows for formation of the sensor pixel 12 on the semiconductor substrate 11. At this time, it is preferable not to use, as an electrode material to be used for the sensor pixel 12, a material having low heat resistance such as $CoSi_2$ and NiSi by Salicide process. Rather, it is preferable to use, as the electrode material to be used for the sensor pixel 12, a material having high heat resistance. Examples of the material having high heat resistance include polysilicon. Thereafter, the insulating layer 46 is formed on the semiconductor substrate 11 (FIG. 8A). In this manner, the first substrate 10 is formed.

Figure 8B:
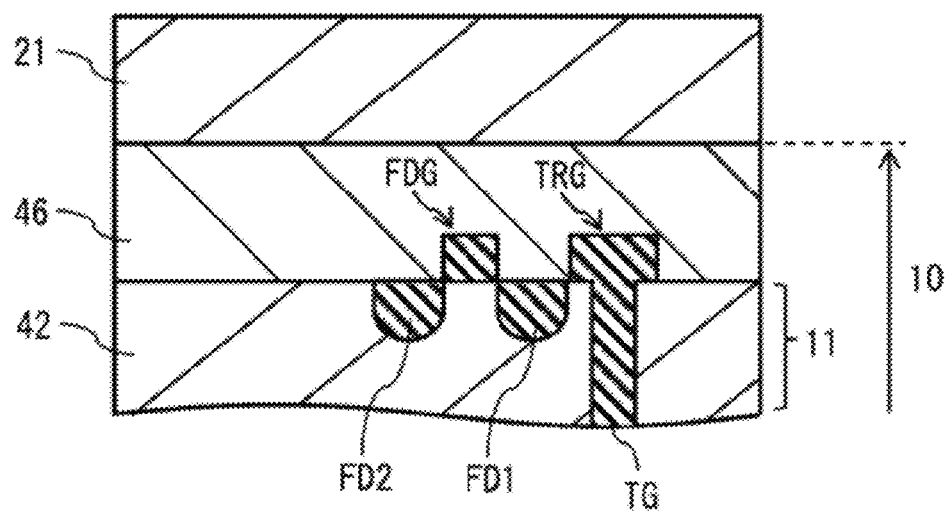
FIG. 8B is an explanatory diagram of a manufacturing process subsequent to FIG. 8A.

Next, the semiconductor substrate 21 is attached onto the first substrate 10 (insulating layer 46) (FIG. 8B). At this time, the semiconductor substrate 21 is thinned as necessary. In this occasion, the thickness of the semiconductor substrate 21 is set to be a film thickness necessary for formation of the readout circuit 22. The thickness of the semiconductor substrate 21 is typically about several hundred nm. However, depending on the concept of the readout circuit 22, an FD (Fully Depletion) type is also available; in such a case, a range of several nm to several μm is also employable as the thickness of the semiconductor substrate 21.

Figure 8C:
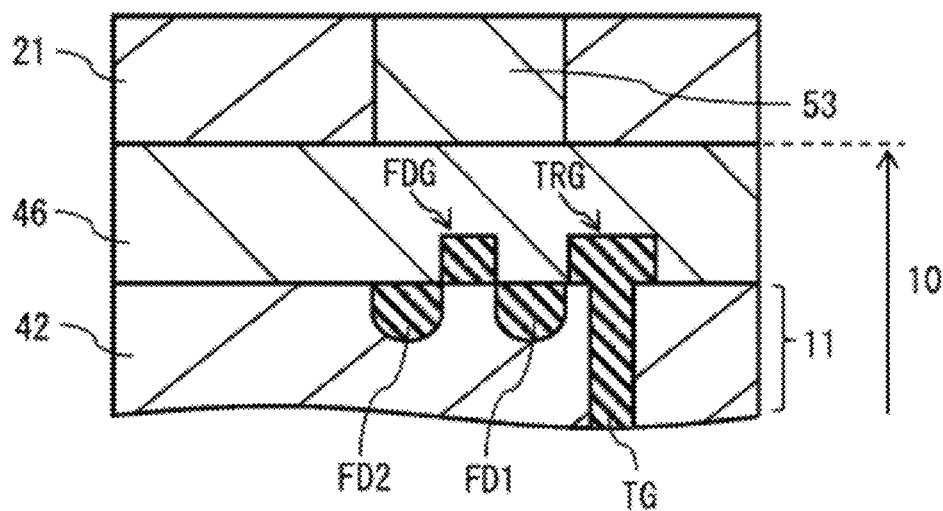
FIG. 8C is an explanatory diagram of a manufacturing process subsequent to FIG. 8B.
Figure 8D:
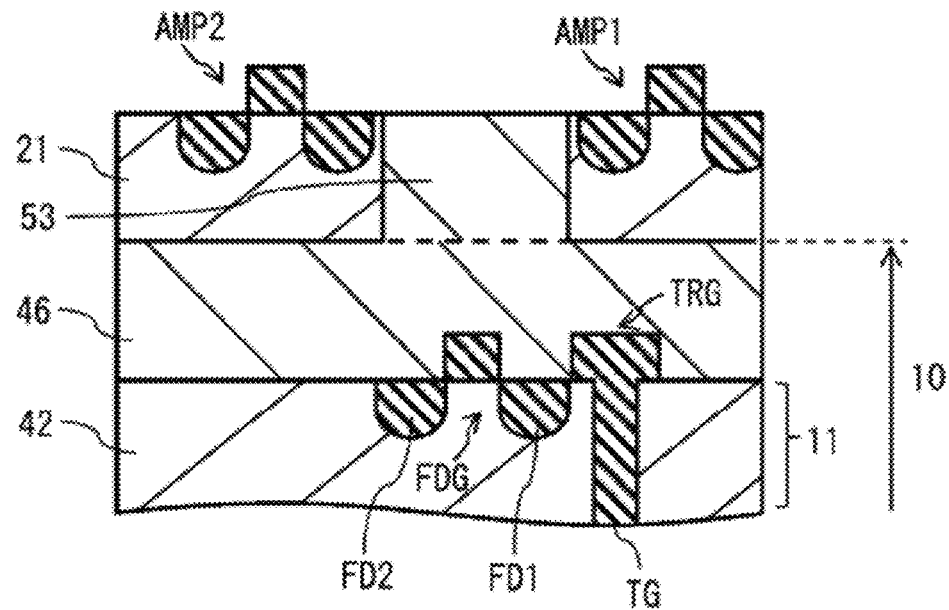
FIG. 8D is an explanatory diagram of a manufacturing process subsequent to FIG. 8C.

Next, the insulating layer 53 is formed inside the same layer as the semiconductor substrate 21 (FIG. 8C). The insulating layer 53 is formed, for example, at a location opposed to the floating diffusions FD1 and FD2. For example, a slit penetrating the semiconductor substrate 21 is formed in the semiconductor substrate 21 to separate the semiconductor substrate 21 into a plurality of blocks thereof. Thereafter, the insulating layer 53 is formed to fill the slit. Thereafter, the readout circuit 22 including the amplification transistors AMP1 and AMP2, the selection transistors SEL1 and SEL2, and the like is formed in each of the blocks of the semiconductor substrate 21 (FIG. 8D). At this time, in a case where a metal material having high heat resistance is used as the electrode material of the sensor pixel 12, it is possible to form a gate insulating film of the readout circuit 22 by thermal oxidation. In addition, an electrode of each transistor included in the readout circuit 22 may include a silicide. The readout circuit 22 is formed after the formation of the sensor pixel 12. Therefore, it is possible to use a silicide having low heat resistance for a surface of an impurity diffusion region to be in contact with a source electrode and a drain electrode of each of the transistors included in the readout circuit 22.

Figure 8E:
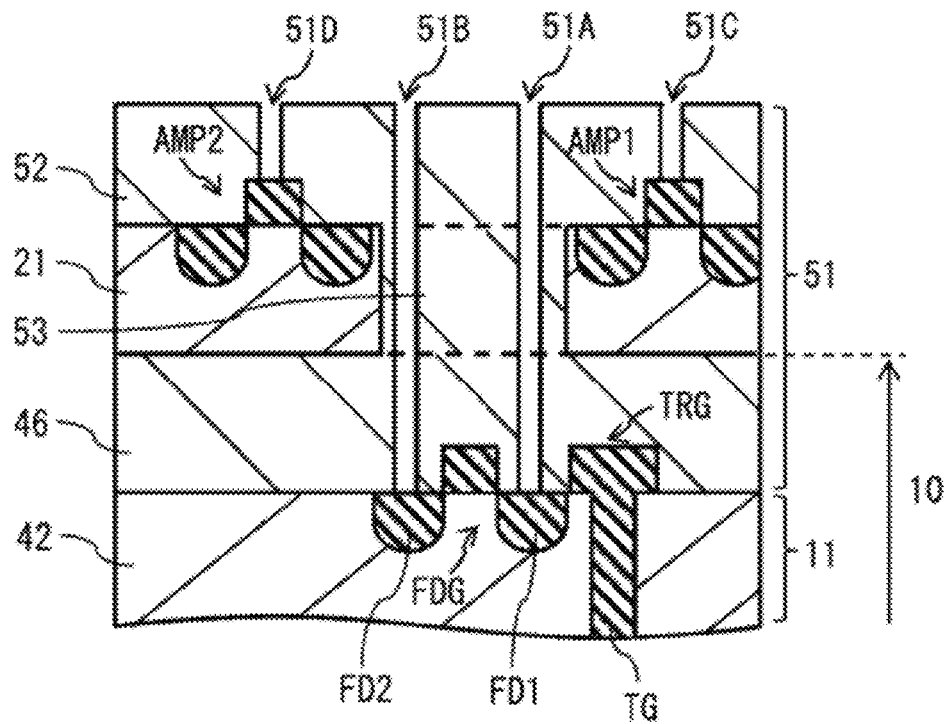
FIG. 8E is an explanatory diagram of a manufacturing process subsequent to FIG. 8D.

Next, the insulating layer 52 is formed on the semiconductor substrate 21. In this manner, the interlayer insulating film 51 including the insulating layers 46, 52, and 53 is formed. Subsequently, through-holes 51A, 51B, 51C, and 51D are formed in the interlayer insulating film 51 (FIG. 8E). Specifically, the through-holes 51C and 51D penetrating the insulating layer 52 are formed at locations, of the insulating layer 52 being a portion of the interlayer insulating film 51, facing the readout circuit 22 (e.g., amplification transistors AMP1 and AMP2). In addition, the through-holes 51A and 51B penetrating the interlayer insulating film 51 are formed at locations, of the interlayer insulating film 51, opposed to the floating diffusions FD1 and FD2 (i.e., locations facing the insulating layer 53).

Figure 8F:
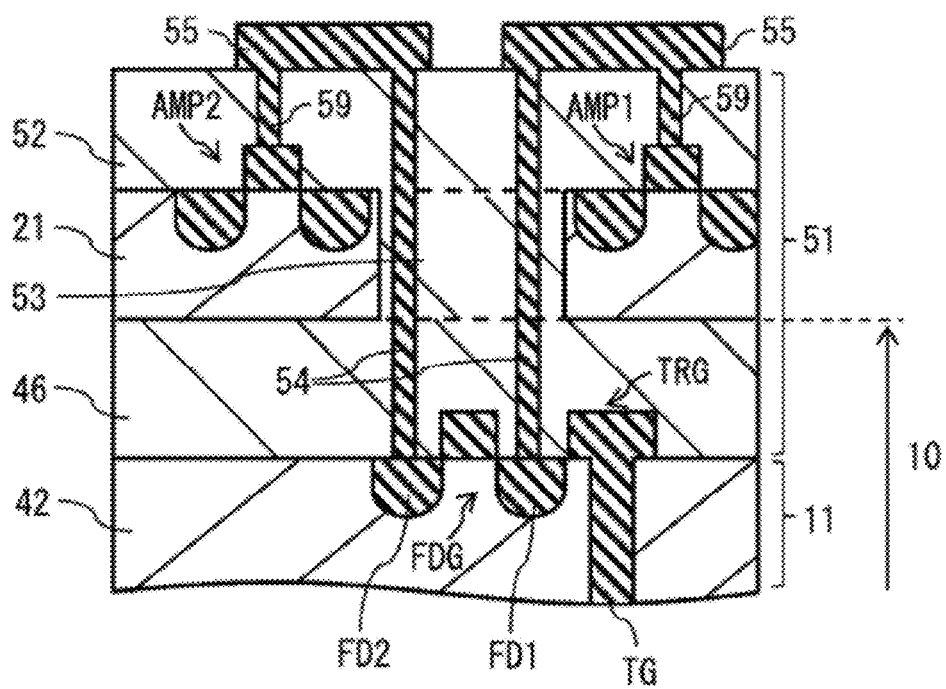
FIG. 8F is an explanatory diagram of a manufacturing process subsequent to FIG. 8E.

Next, embedding an electrically-conductive material in the through-holes 51A, 51B, 51C, and 51D allows for formation of the through-wiring line 54 inside the through-holes 51A and 51B as well as formation of the coupling section 59 inside the through-holes 51C and 51D (FIG. 8F). Further, the coupling wiring line 55 electrically coupling the through-wiring line 54 and the coupling section 59 to each other is formed on the insulating layer 52 (FIG. 8F). Thereafter, the wiring layer 56 including the pad electrode 58 is formed on the insulating layer 52. In this manner, the second substrate 20 is formed.

Figure 8G:
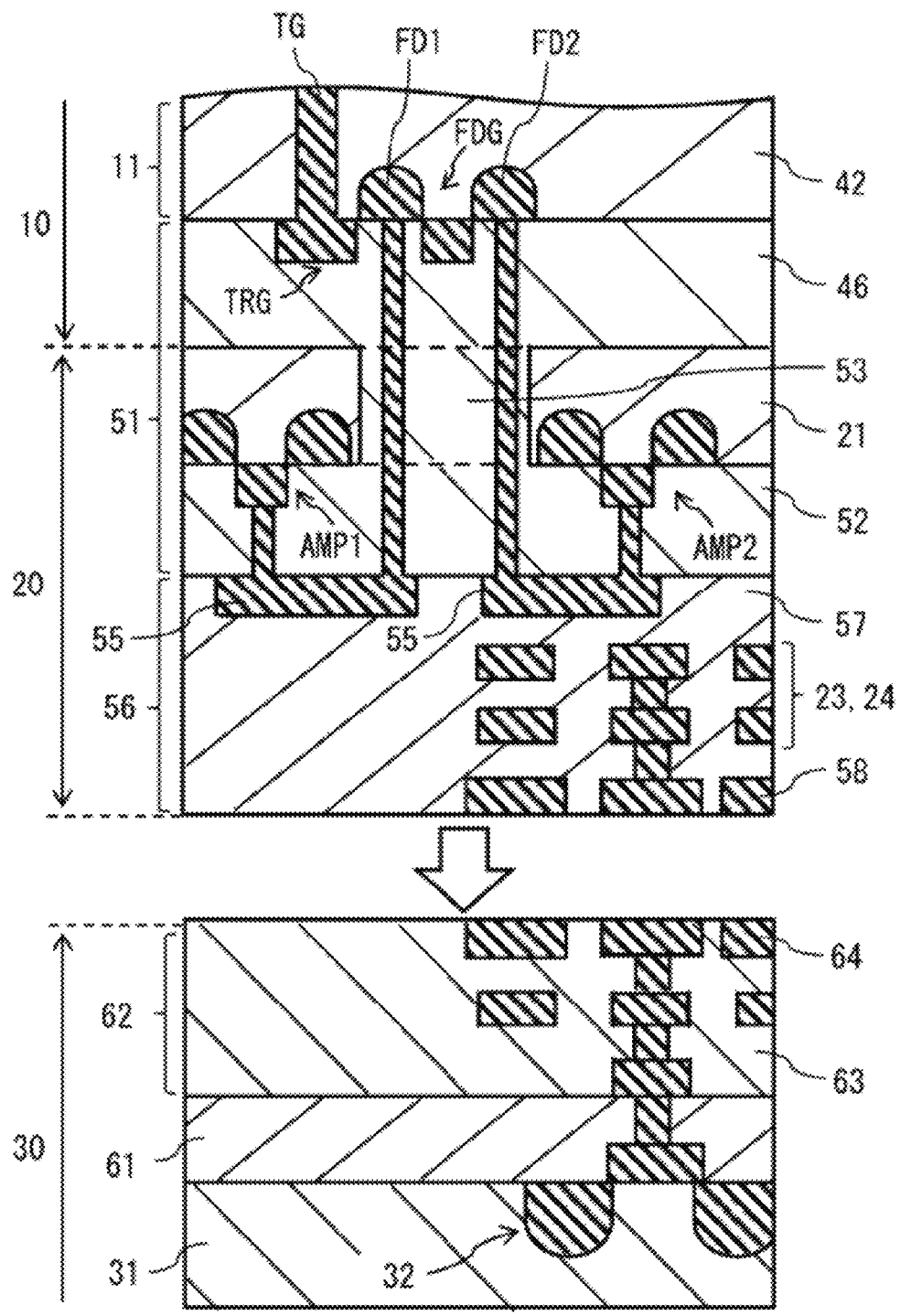
FIG. 8G is an explanatory diagram of a manufacturing process subsequent to FIG. 8F.

Next, the second substrate 20 is attached to the third substrate 30 in which the logic circuit 32 and the wiring layer 62 are formed, with the top surface of the semiconductor substrate 21 being opposed to side of the top surface of the semiconductor substrate 31 (FIG. 8G). At this time, the pad electrode 58 of the second substrate 20 and the pad electrode 64 of the third substrate 30 are bonded to each other, thereby electrically coupling the second substrate 20 and the third substrate 30 to each other. In this manner, the solid-state imaging device 1 is manufactured. [Effects]

Next, description is given of effects of the solid-state imaging device 1 according to the present embodiment.

The CMOS image sensor has desirably high sensitivity to enable an imaging signal to be acquired even during low illuminance. In addition, in order to enlarge a dynamic range, it is desirable that a photodiode be less likely to be saturated. However, there is a trade-off relationship between the high sensitivity and the photodiode being less likely to be saturated, and thus it is difficult to expand the dynamic range while maintaining the high sensitivity. Therefore, for example, the above-mentioned PTL 1 discloses that a floating diffusion with small capacity and a floating diffusion with large capacity are provided and that the floating diffusion with small capacity is coupled to a photodiode during low illuminance, whereas the floating diffusion with large capacity is coupled during high illuminance. However, in a case where the invention described in PTL 1 is applied to a high-definition use application, there is an issue of difficulty in securing an enough space to provide two floating diffusions.

Meanwhile, in the present embodiment, the amplification transistors AMP1 and AMP2 to be used are selected depending on the mode. This makes it possible to expand the dynamic range while maintaining high sensitivity. In addition, in the present embodiment, at least the amplification transistors AMP1 and AMP2 are formed in the second substrate 20 different from the first substrate 10 in which the photodiode PD is formed. Specifically, the photodiode PD, the transfer transistor TRG, the floating diffusions FD1 and FD2, and the switching transistor FDG are formed in the first substrate 10, and the reset transistor RST, the amplification transistors AMP1 and AMP2, and the selection transistors SEL1 and SEL2 are formed in the second substrate 20. This makes it possible to secure an enough space to provide the floating diffusions FD1 and FD2 and the amplification transistors AMP1 and AMP2 even when the solid-state imaging device 1 has high definition. As a result, even in the high-definition use applications, it is possible to achieve both high sensitivity and a high dynamic range.

In addition, in the present embodiment, in a case where the electrode of each of the transistors included in the readout circuit 22 includes a silicide, it is possible to reduce parasitic resistance of each of the transistors included in the readout circuit 22. As a result, it is possible to achieve reduction in noises.

It is to be noted that, in the present embodiment, the vertical drive circuit 33 may change a drive current depending on magnitude of sizes of the amplification transistors AMP1 and AMP2 that are converted by switching of the switching transistor FDG under the control of the system control circuit 36. In such a case, it is possible to prevent a decrease in a drive current per unit amplification transistor, thus making it possible to suppress deterioration of noise characteristics.

2. Modification Examples

Hereinafter, description is given of modification examples of the solid-state imaging device 1 according to the foregoing embodiment.

Modification Example A

Figure 9:
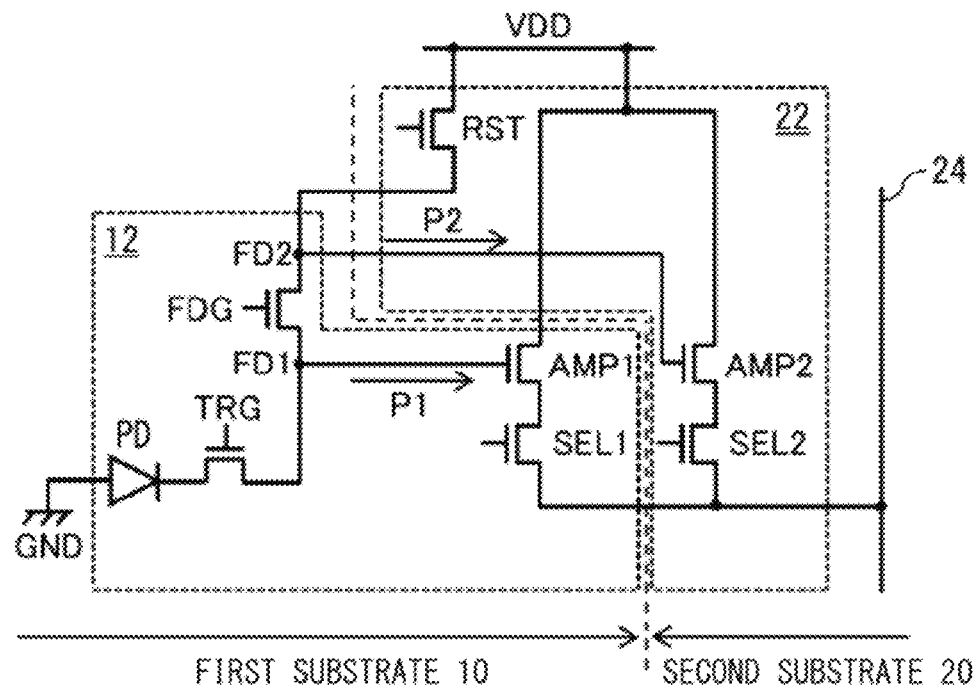
FIG. 9 illustrates a modification example of the sensor pixel and the readout circuit of FIG. 1.

FIG. 9 illustrates a modification example of the circuit configuration of the sensor pixel 12 and the readout circuit 22 of the solid-state imaging device 1 according to the foregoing embodiment. In the present modification example, the photodiode PD, the transfer transistor TRG, the floating diffusions FD1 and FD2, the switching transistor FDG, the amplification transistor AMP1, and the selection transistor SEL1 are formed in the first substrate 10. Meanwhile, the reset transistor RST, the amplification transistor AMP2, and the selection transistor SEL2 are formed in the second substrate 20. Even in such a case, similarly to the foregoing embodiment, it is possible to secure an enough space to provide the floating diffusions FD1 and FD2 and the amplification transistors AMP1 and AMP2. As a result, even in a high-definition use application, it is possible to achieve both high sensitivity and a high dynamic range.

Figure 10:
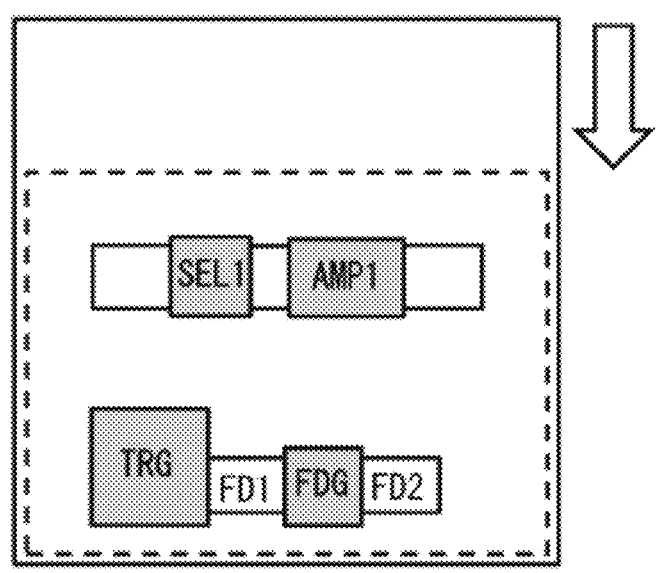
FIG. 10 illustrates a modification example of the cross-sectional configuration of FIG. 4.
Figure 11:
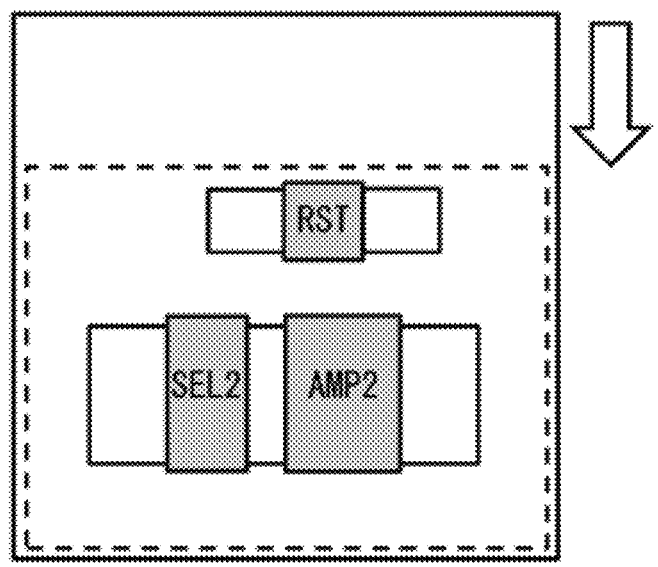
FIG. 11 illustrates a modification example of the cross-sectional configuration of FIG. 5.
Figure 12:
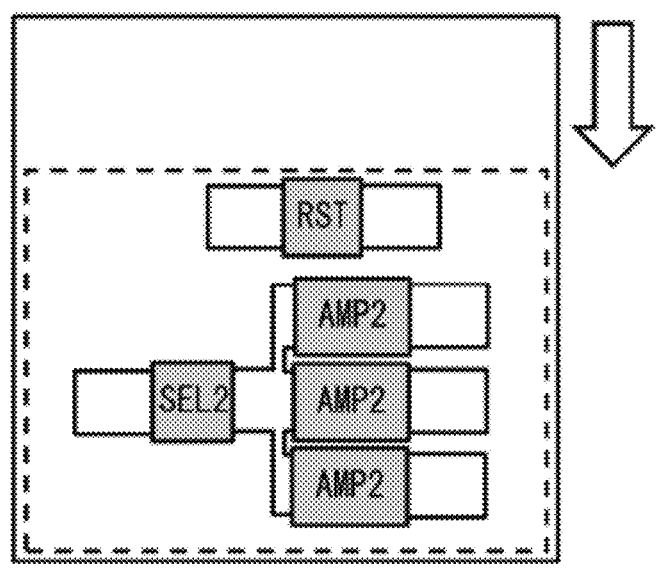
FIG. 12 illustrates a modification example of the cross-sectional configuration of FIG. 7.

FIG. 10 illustrates an example of a top surface configuration of the semiconductor substrate 11 in the solid-state imaging device 1 having the configuration illustrated in FIG. 9. FIGS. 11 and 12 each illustrate an example of a top surface configuration of the semiconductor substrate 21 in the solid-state imaging device 1 having the configuration illustrated in FIG. 9. In the present modification example, it is possible to accommodate the photodiode PD, the transfer transistor TRG, the floating diffusions FD1 and FD2, the switching transistor FDG, the amplification transistor AMP1, and the selection transistor SEL1 in a small area, for example, as illustrated in FIG. 10. Likewise, it is possible to accommodate the reset transistor RST, the amplification transistor AMP2, and the selection transistor SEL2 in a small area, for example, as illustrated in FIGS. 11 and 12. In this manner, in a case where the occupied area is reduced in this manner, it is possible to miniaturize the solid-state imaging device 1.

Modification Example B

Figure 13:
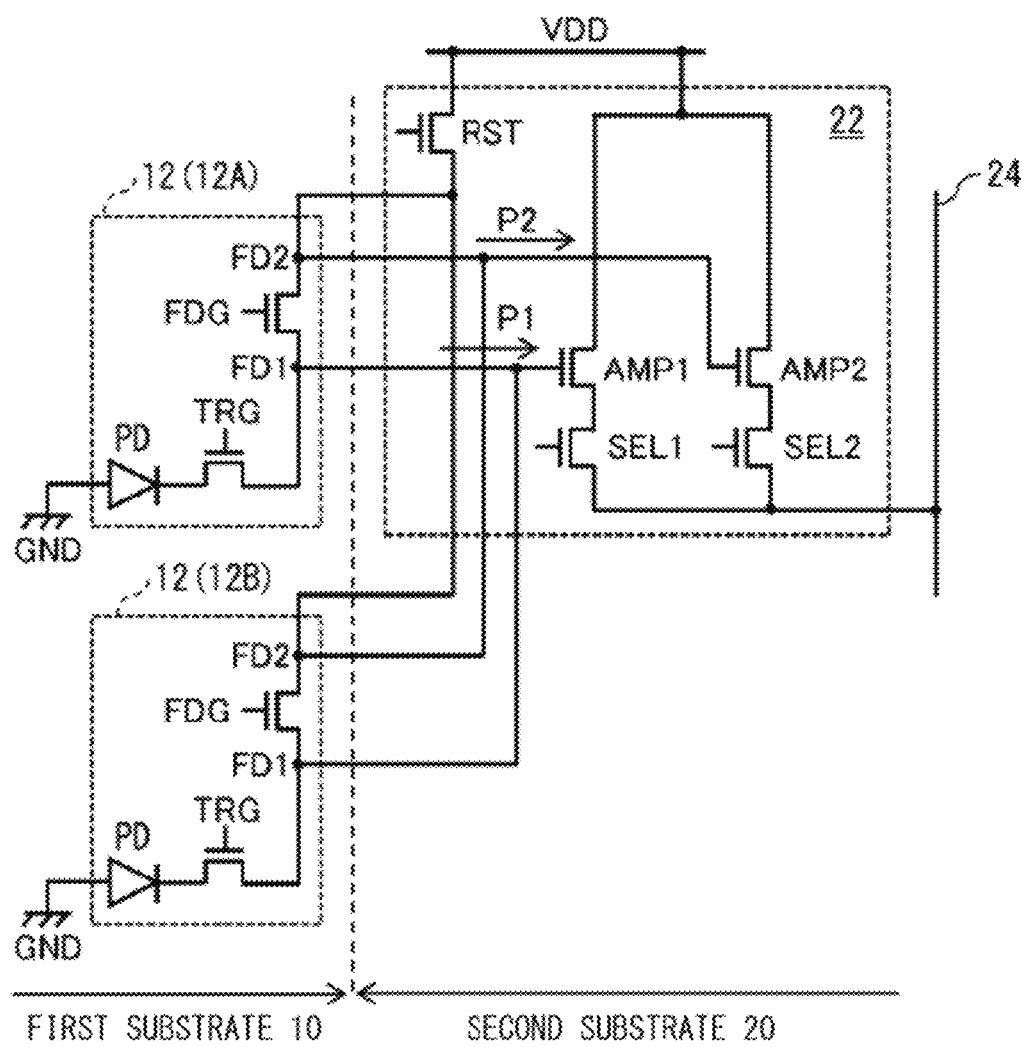
FIG. 13 illustrates a modification example of the sensor pixel and the readout circuit of FIG. 1.

FIG. 13 illustrates a modification example of the circuit configuration of the sensor pixel 12 and the readout circuit 22 of the solid-state imaging device 1 according to the foregoing embodiment. In the present modification example, two sensor pixels 12 (12A and 12B) share one readout circuit 22. Here, the term "share" means that outputs of the two sensor pixels 12 (12A and 12B) are inputted to the readout circuit 22 in common. In such a case, the one readout circuit 22 is formed in a region, of the semiconductor substrate 21, facing the two sensor pixels 12. Accordingly, as compared with the foregoing embodiment, an area for forming one readout circuit 22 is able to be expanded by two times, thus making it possible to secure an enough space to provide the floating diffusions FD1 and FD2 and the amplification transistors AMP1 and AMP2. As a result, it is possible to achieve both high sensitivity and a high dynamic range even in a high-definition use application.

Modification Example C

Figure 14:
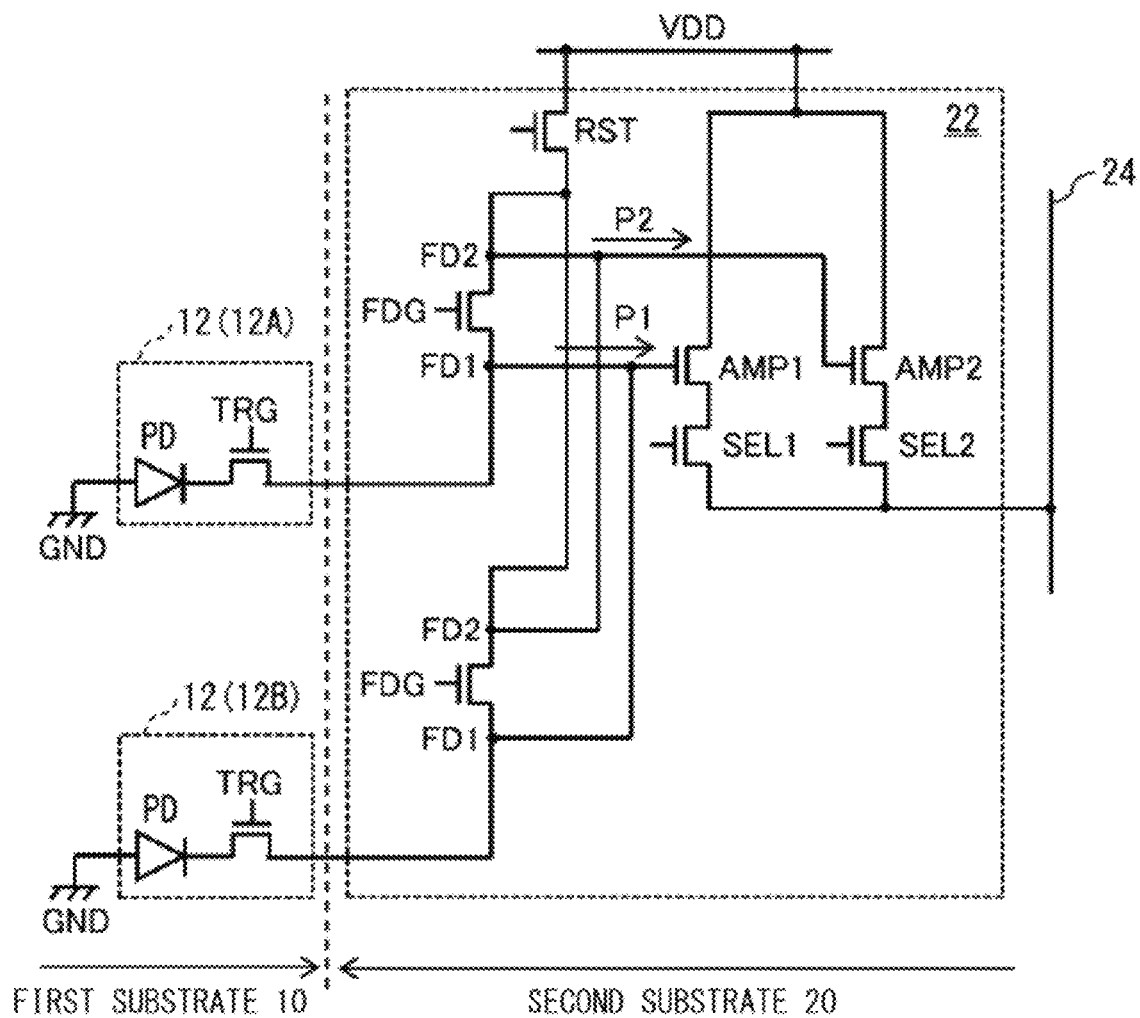
FIG. 14 illustrates a modification example of the sensor pixel and the readout circuit of FIG. 1.

FIG. 14 illustrates a modification example of the circuit configuration of the sensor pixel 12 and the readout circuit 22 of the solid-state imaging device 1 according to the foregoing modification example B. In the present modification example, the photodiode PD and the transfer transistor TRG are formed in the first substrate 10. Meanwhile, the floating diffusions FD1 and FD2, two switching transistors FDG, the amplification transistors AMP1 and AMP2, and the selection transistors SEL1 and SEL2 are formed in the second substrate 20. Even in such a case, similarly to the foregoing modification example B, it is possible to secure an enough space to provide the floating diffusions FD1 and FD2 and the amplification transistors AMP1 and AMP2. As a result, even in a high-definition use application, it is possible to achieve both high sensitivity and a high dynamic range.

Modification Example D

Figure 15:
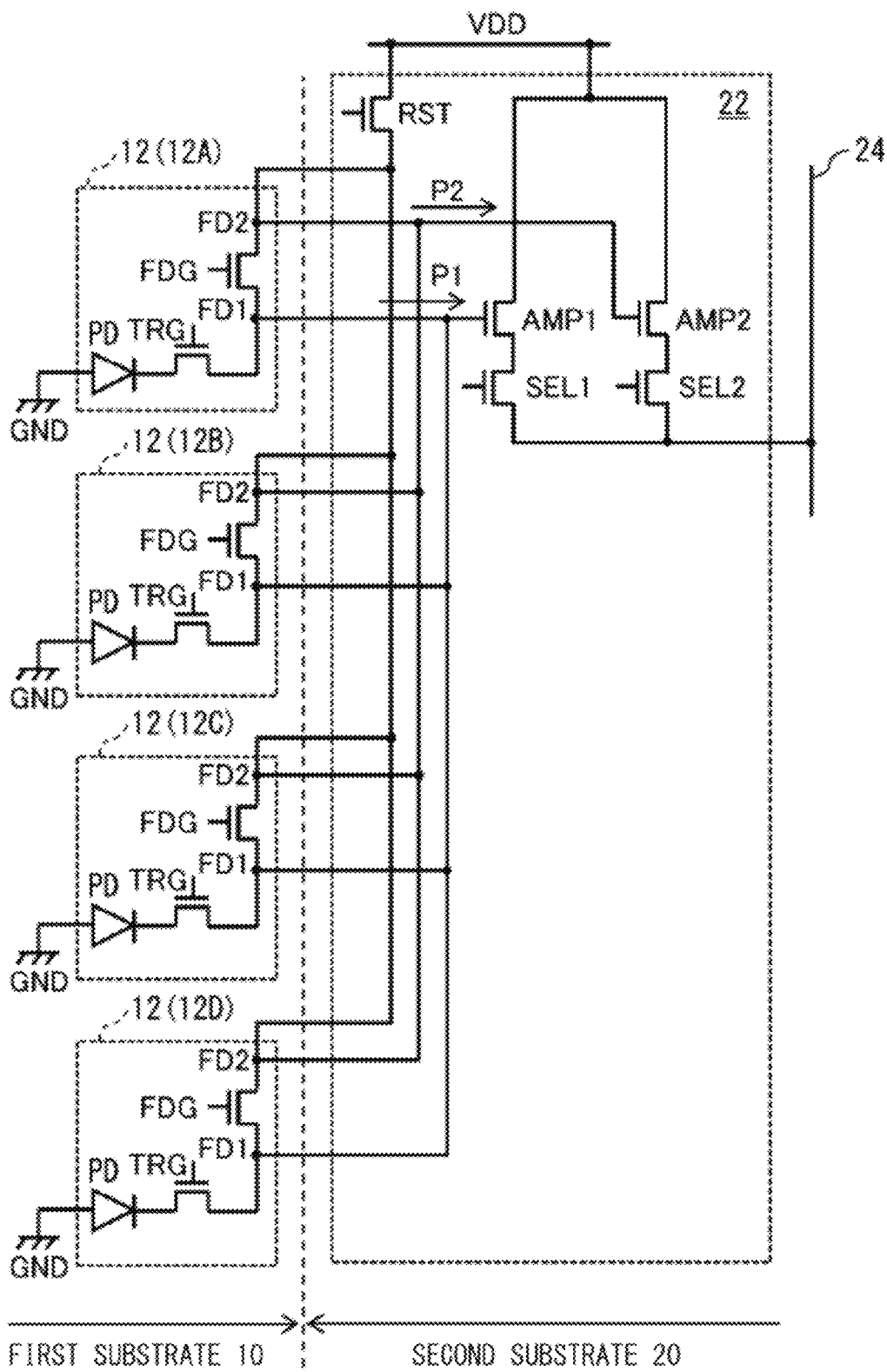
FIG. 15 illustrates a modification example of the sensor pixel and the readout circuit of FIG. 1.

FIG. 15 illustrates a modification example of the circuit configuration of the sensor pixel 12 and the readout circuit 22 of the solid-state imaging device 1 according to the foregoing modification example B. In the present modification example, four sensor pixels 12 (12A, 12B, 12C, and 12D) share one readout circuit 22. In such a case, the one readout circuit 22 is formed in a region, of the second substrate 20, facing the four sensor pixels 12. Accordingly, as compared with the foregoing embodiment, an area for forming one readout circuit 22 is able to be expanded by four times, thus making it possible to secure an enough space to provide the floating diffusions FD1 and FD2 and the amplification transistors AMP1 and AMP2. As a result, it is possible to achieve both high sensitivity and a high dynamic range even in a high-definition use application.

Modification Example E

Figure 16:
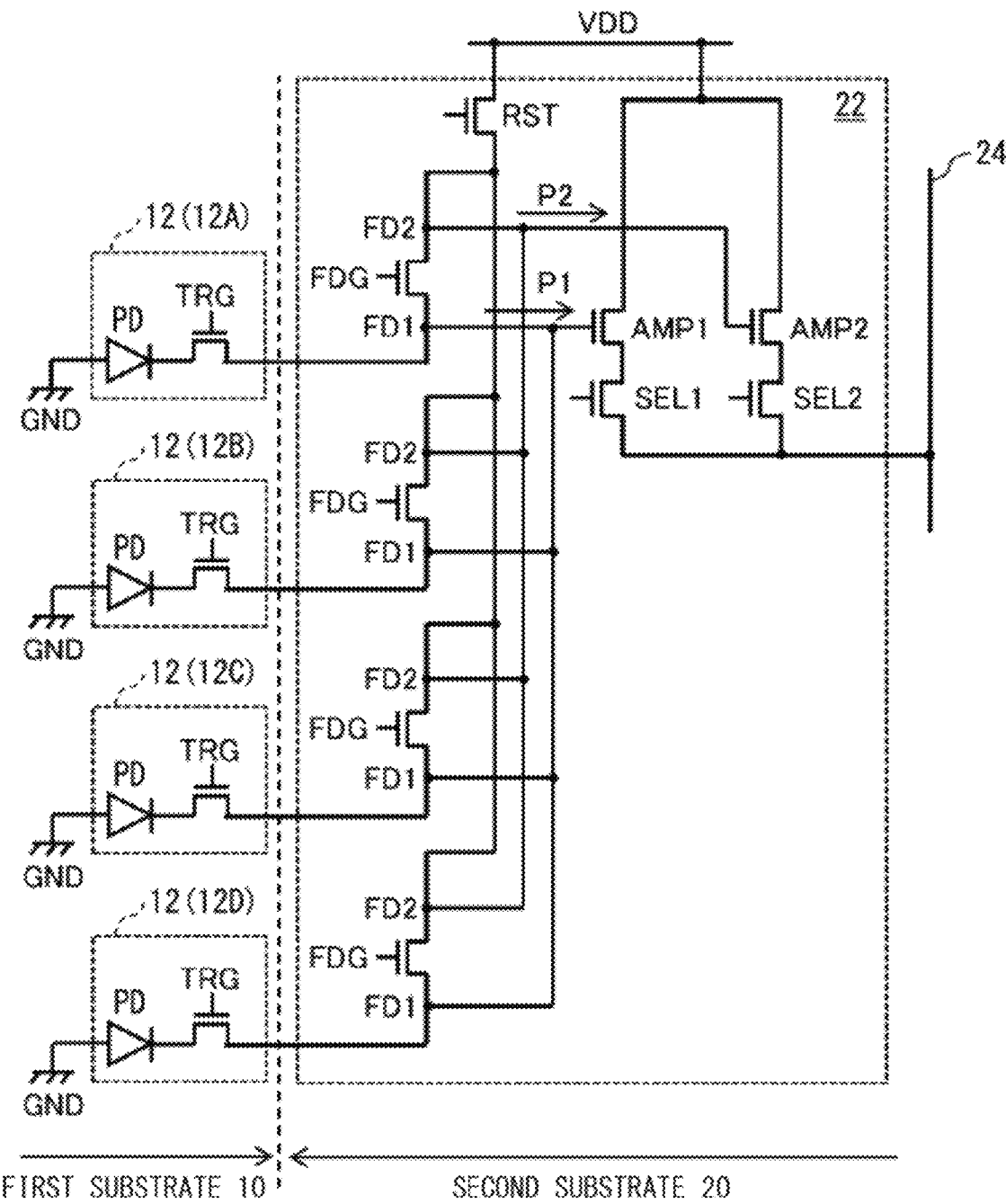
FIG. 16 illustrates a modification example of the sensor pixel and the readout circuit of FIG. 1.

FIG. 16 illustrates a modification example of the circuit configuration of the sensor pixel 12 and the readout circuit 22 of the solid-state imaging device 1 according to the foregoing modification example C. In the present modification example, four sensor pixels 12 (12A, 12B, 12C, and 12D) share one readout circuit 22. In such a case, the one readout circuit 22 is formed in a region, of the second substrate 20, facing the four sensor pixels 12. Accordingly, as compared with the foregoing embodiment, an area for forming one readout circuit 22 is able to be expanded by four times, thus making it possible to secure an enough space to provide the floating diffusions FD1 and FD2 and the amplification transistors AMP1 and AMP2. As a result, it is possible to achieve both high sensitivity and a high dynamic range even in a high-definition use application.

Modification Example F

Figure 17:
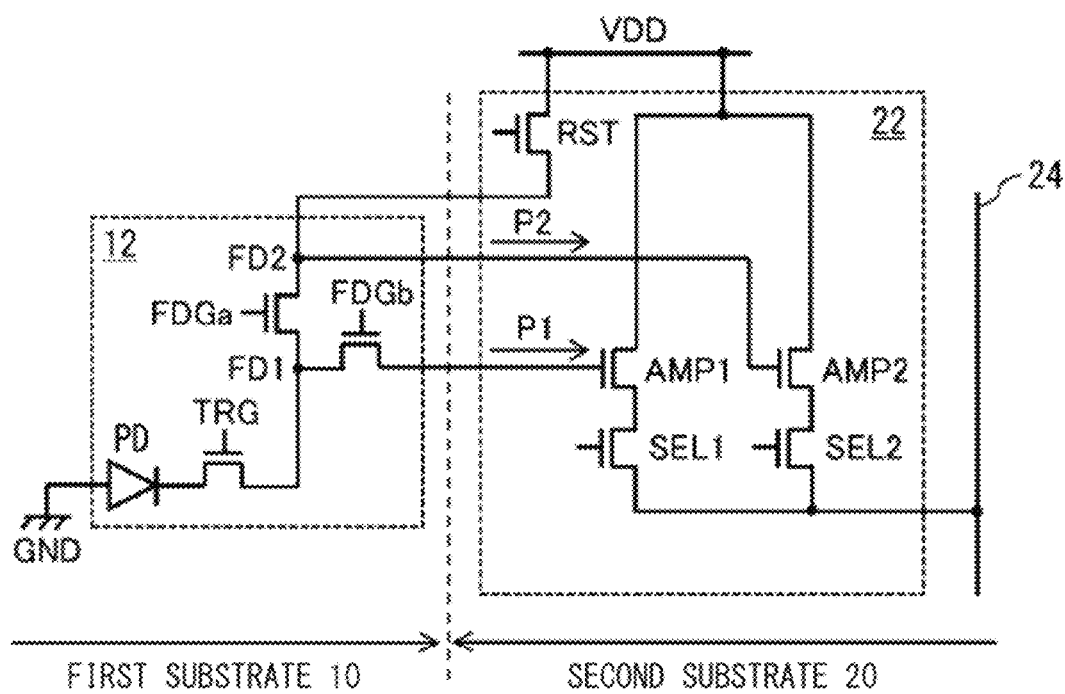
FIG. 17 illustrates a modification example of the sensor pixel and the readout circuit of FIG. 1.

FIG. 17 illustrates a modification example of the circuit configuration of the sensor pixel 12 and the readout circuit 22 of the solid-state imaging device 1 according to the foregoing embodiment. In the present modification example, a switching transistor FDGa having the same configuration as that of the switching transistor FDG is provided at a location where the switching transistor FDG is provided, and a switching transistor FDGb is further provided in the middle of a wiring line linking the floating diffusion FD1 and the gate of the amplification transistor AMP1 to each other. The switching transistors FDGa and FDGb are each, for example, an NMOS transistor.

Also in the present modification example, the FD capacity C is switched between the time of the high-sensitivity low-illuminance mode (first mode) and the time of the low-sensitivity high-illuminance mode (second mode). Specifically, under the control of the system control circuit 36, the vertical drive circuit 33 electrically couples the signal path P1 to the photodiode PD and electrically decouples the signal path P2 from the photodiode PD in the first mode. Under the control of the system control circuit 36, the vertical drive circuit 33 electrically couples both of the signal path P1 and the signal path P2 to the photodiode PD in the second mode. For example, in the first mode, the vertical drive circuit 33 brings the switching transistor FDGa into an OFF state and brings the switching transistor FDGb into an ON state. Further, for example, in the second mode, the vertical drive circuit 33 brings the switching transistor FDGa into an ON state and brings the switching transistor FDGb also into an ON state. By configuring in this manner, it is possible to achieve both high sensitivity and a high dynamic range even in a high-definition use application, similarly to the foregoing embodiment.

In the present modification example, two sensor pixels 12 may share one readout circuit 22. In addition, in the present modification example, four sensor pixels 12 may share one readout circuit 22. In such a case, it is possible to achieve both high sensitivity and a high dynamic range even in a high-definition use application, similarly to the foregoing modification examples B to E.

Modification Example G

Figure 18:
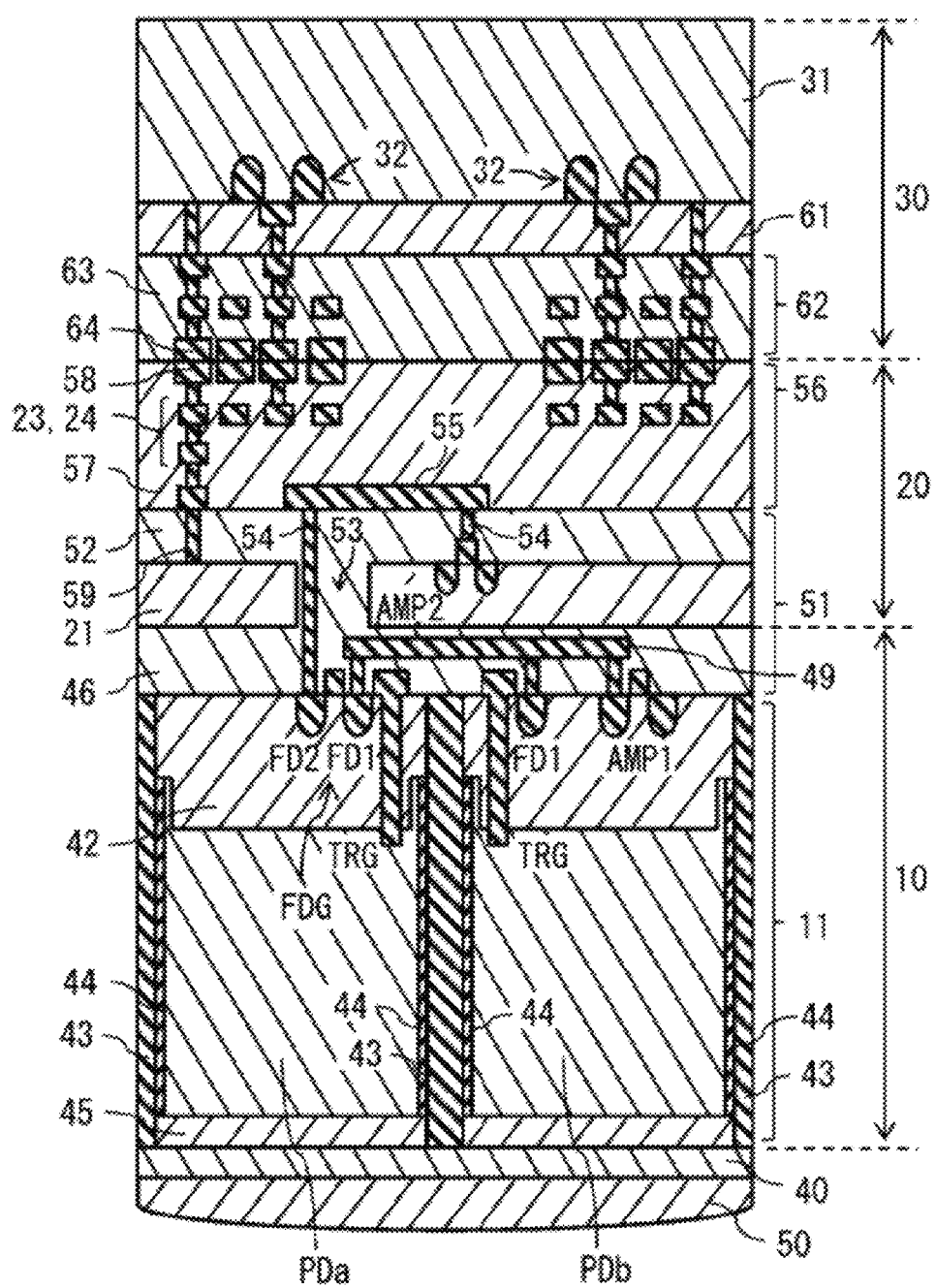
FIG. 18 illustrates a modification example of the cross-sectional configuration in the vertical direction of the solid-state imaging device of FIG. 1.

FIG. 18 illustrates a modification example of the cross-sectional configuration of the solid-state imaging device 1 according to any of the foregoing embodiment and modification examples thereof. In the present modification example, two photodiodes PD are provided for one light-receiving lens 50, and these two photodiodes PD are separated from each other by the element separation section 43. Hereinafter, two photodiodes PD provided to correspond to the one light-receiving lens 50 are referred to as photodiodes PDa and PDb.

In the present modification example, the floating diffusion FD1 is provided one by one for each of the photodiodes PDa and PDb. Meanwhile, one switching transistor FDG is assigned for the photodiodes PDa and PDb. Accordingly, the floating diffusion FD1 provided for the photodiode PDa and the floating diffusion FD1 provided for the photodiode PDb are electrically coupled to each other by a coupling wiring line 49 provided inside the insulating layer 46.

In addition, in the present modification example, the photodiodes PDa and PDb, two transfer transistor TRG, the two floating diffusions FD1, one floating diffusion FD2, the switching transistor FDG, the amplification transistor AMP1, and the selection transistor SEL1 are formed in the first substrate 10. Meanwhile, the reset transistor RST, the amplification transistor AMP2, and the selection transistor SEL2 are formed in the second substrate 20. Even in such a case, similarly to the foregoing embodiment, it is possible to secure an enough space to provide the floating diffusions FD1 and FD2 and the amplification transistors AMP1 and AMP2. As a result, even in a high-definition use application, it is possible to achieve both high sensitivity and a high dynamic range.

Modification Example H

Figure 19:
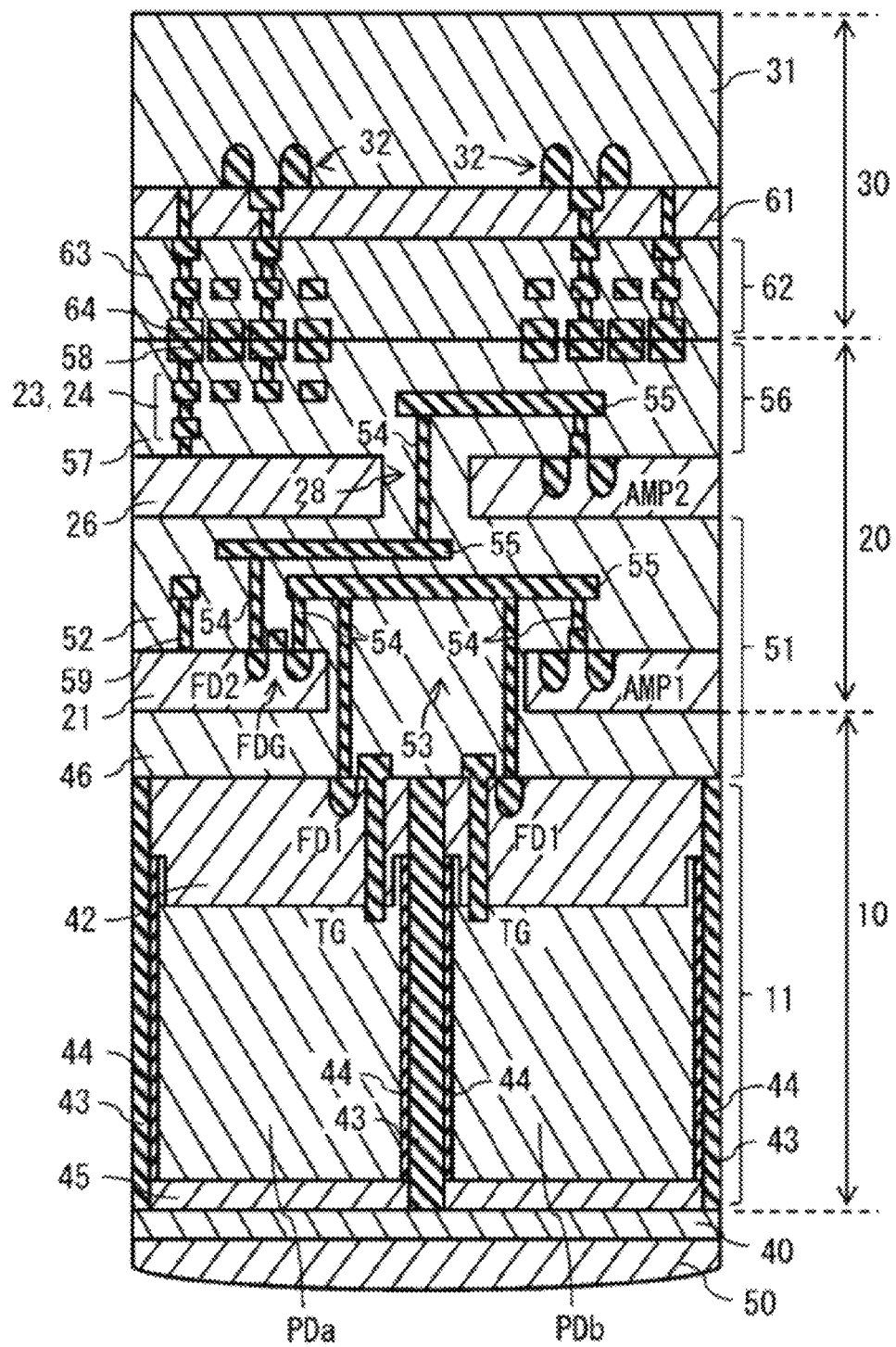
FIG. 19 illustrates a modification example of the cross-sectional configuration in the vertical direction of the solid-state imaging device of FIG. 1.

FIG. 19 illustrates a modification example of the cross-sectional configuration of the solid-state imaging device 1 according to the foregoing modification example G. In the present modification example, the floating diffusion FD1 is provided one by one for each of the photodiodes PDa and PDb. Meanwhile, one switching transistor FDG is assigned for the photodiodes PDa and PDb. Accordingly, the floating diffusion FD1 provided for the photodiode PDa and the floating diffusion FD1 provided for the photodiode PDb are electrically coupled to each other by the coupling wiring line 55 provided inside the insulating layer 52. The floating diffusion FD1 provided for the photodiode PDa and the floating diffusion FD1 provided for the photodiode PDb are coupled to the switching transistor FDG and the gate of the amplification transistor AMP1 via the coupling wiring line 55 and the through-wiring line 54.

In the present modification example, the second substrate 20 includes two semiconductor substrates 21 and 26. The semiconductor substrate 26 is stacked over the semiconductor substrate 21 with the interlayer insulating film 51 (insulating layer 52) interposed therebetween. The semiconductor substrate 26 is provided between the interlayer insulating film 51 (insulating layer 52) and the insulating layer 57. The semiconductor substrate 26 has an opening, and the opening is provided with a portion of the insulating layer 57 (hereinafter referred to as an "insulating layer 28"). The through-wiring line 54 penetrates the insulating layer 28. The through-wiring line 54 penetrating the insulating layer 28 electrically couples the floating diffusion FD2 and the gate of the amplification transistor AMP2 to each other via the coupling wiring line 55 and another through-wiring line 54.

In the present modification example, the photodiodes PDa and PDb and the two floating diffusions FD1 are formed in the first substrate 10, the amplification transistor AMP1, the floating diffusion FD2 and the switching transistor FDG are formed in the semiconductor substrate 21 of the second substrate 20, and the amplification transistor AMP2 is formed in the semiconductor substrate 26 of the second substrate 20. Even in such a case, similarly to the foregoing embodiment, it is possible to secure an enough space to provide the floating diffusions FD1 and FD2 and the amplification transistors AMP1 and AMP2. As a result, even in a high-definition use application, it is possible to achieve both high sensitivity and a high dynamic range.

In the present modification example, an electrode of each of the transistors formed in the semiconductor substrates 21 and 26 may include a silicide. In this case, each of the transistors formed in the semiconductor substrates 21 and 26 is formed after the formation of the sensor pixel 12. Thus, it is possible to use a silicide having low heat resistance for a surface of an impurity diffusion region that is in contact with a source electrode and a drain electrode of each of the transistors included in the readout circuit 22.

Modification Example I

Figure 20:
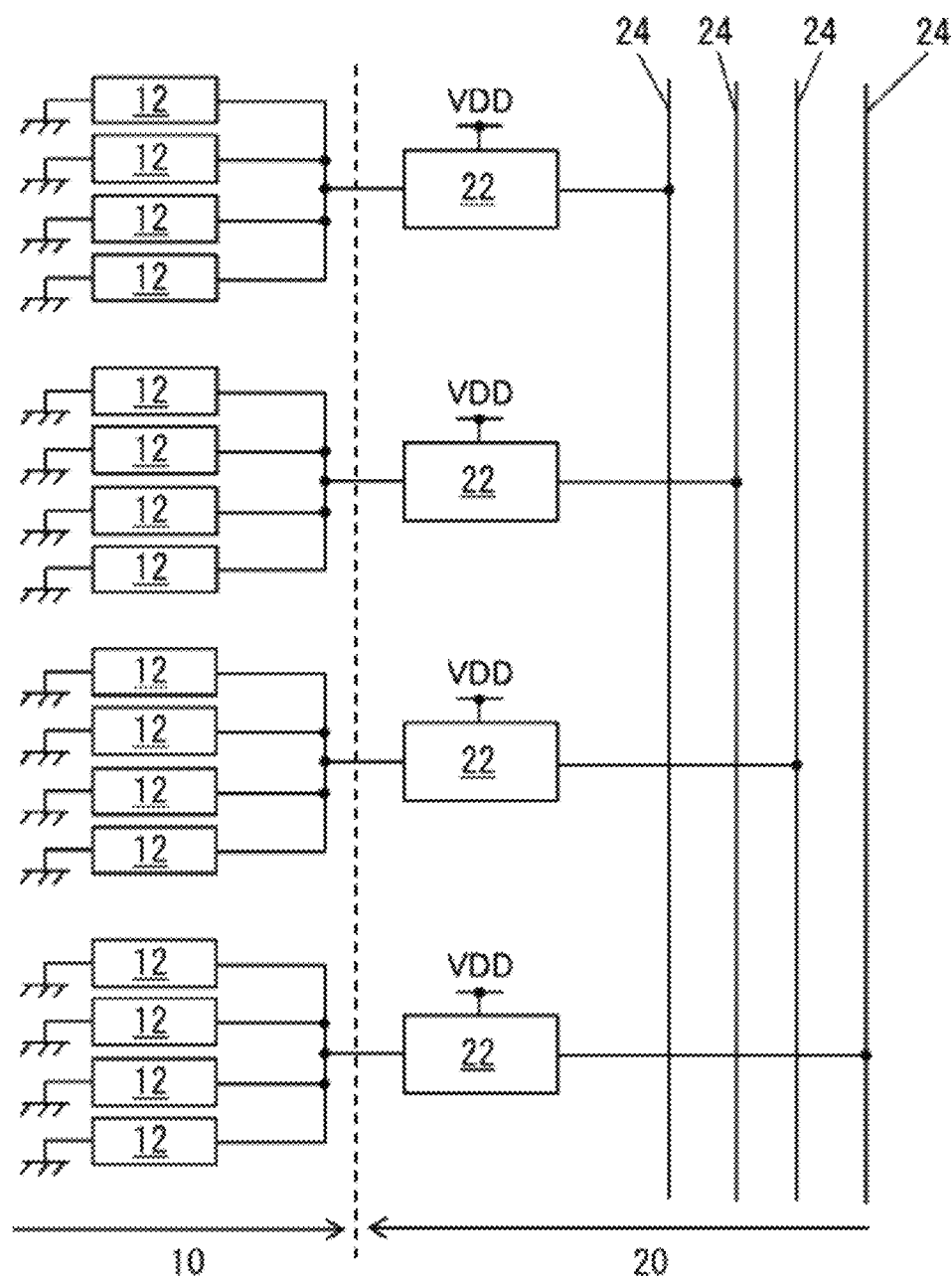
FIG. 20 illustrates a modification example of a coupling mode between a plurality of readout circuits and a plurality of vertical signal lines.

FIG. 20 illustrates an example of a coupling mode between the plurality of readout circuits 22 and the plurality of vertical signal lines 24. In the foregoing embodiment and modification examples thereof, in a case where the plurality of readout circuits 22 are arranged side by side in a direction in which the vertical signal lines 24 extend (e.g., column direction), the plurality of vertical signal lines 24 may be assigned one by one for the respective readout circuits 22. For example, as illustrated in FIG. 20, in a case where four readout circuits 22 are arranged side by side in the direction in which the vertical signal lines 24 extend (e.g., column direction), four vertical signal lines 24 may be assigned one by one for the respective readout circuits 22.

Modification Example J

Figure 21:
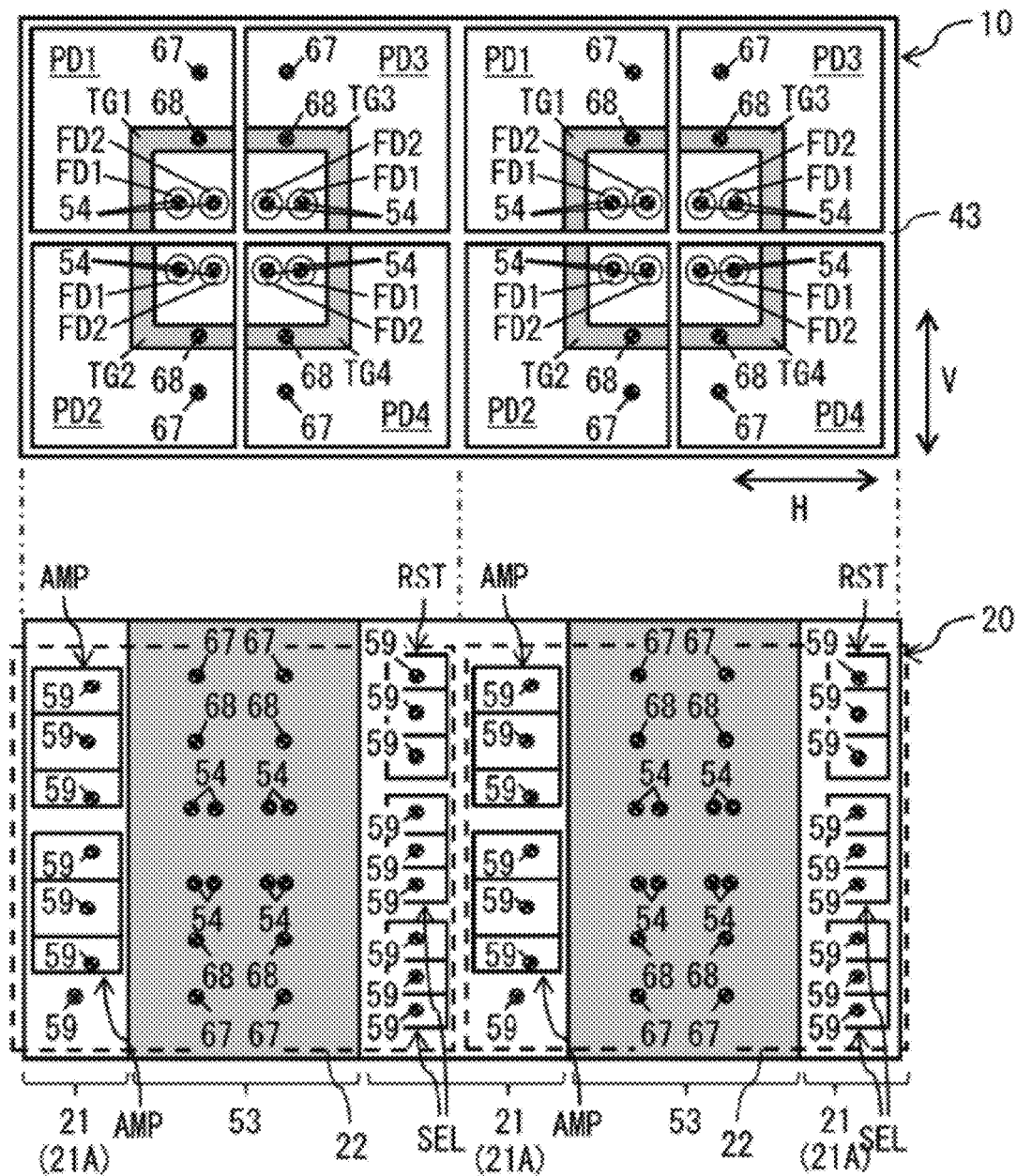
FIG. 21 illustrates a modification example of a cross-sectional configuration in the horizontal direction of a solid-state imaging device having a configuration of FIG. 15.
Figure 22:
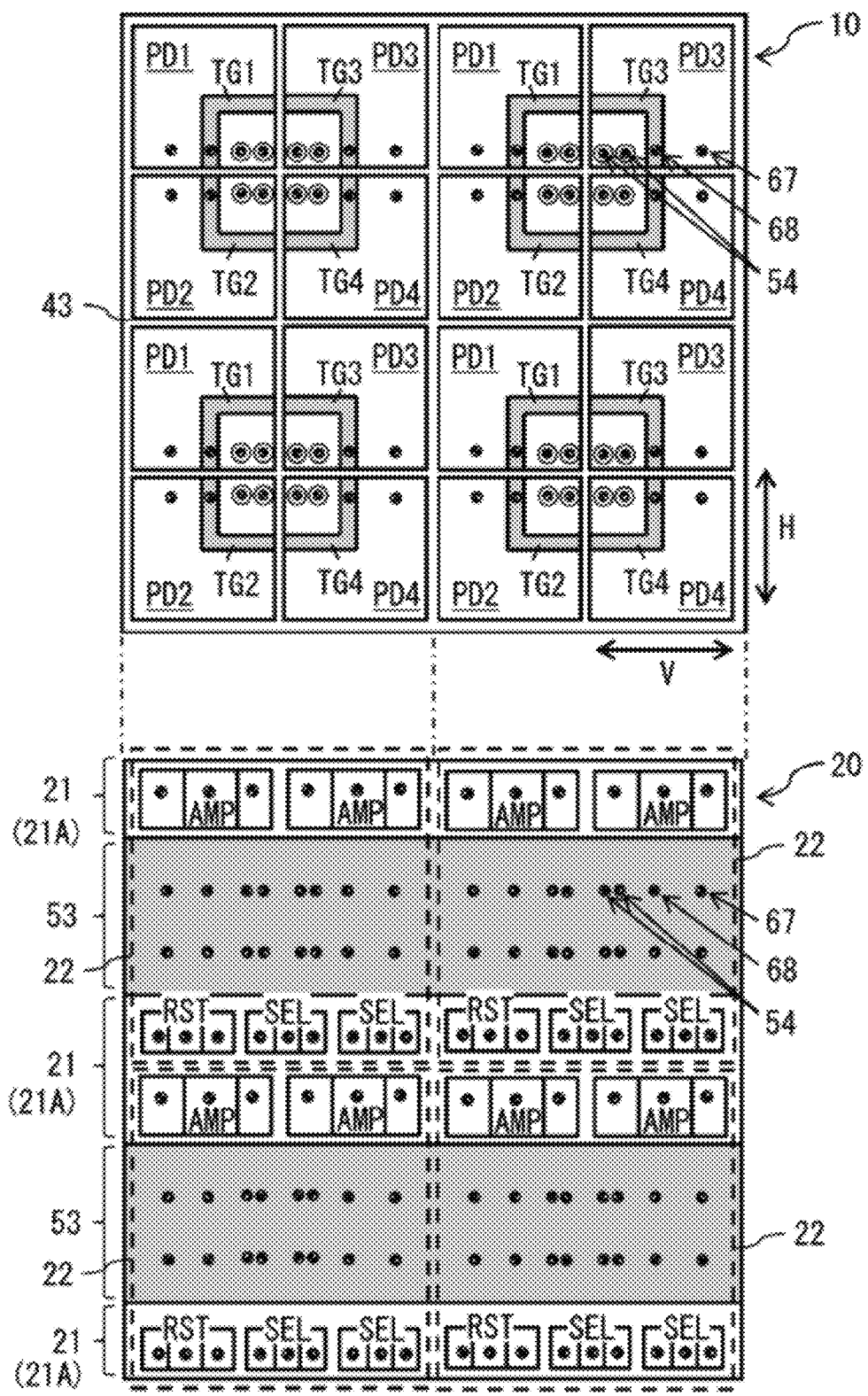
FIG. 22 illustrates a modification example of the cross-sectional configuration in the horizontal direction of the solid-state imaging device having the configuration of FIG. 15.

FIGS. 21 and 22 each illustrate a modification example of the cross-sectional configuration in the horizontal direction of the solid-state imaging device 1 having the configuration of FIG. 15, for example. Upper drawings in FIGS. 21 and 22 each illustrate an example of a cross-sectional configuration of the first substrate 10 in the solid-state imaging device 1 having the configuration of the modification example D. The upper drawings of FIGS. 21 and 22 each exemplify a cross-sectional configuration of a location, of the first substrate 10 of the solid-state imaging device 1 having the configuration of the modification example D, corresponding to a cross-section Sec1 of FIG. 3. It is to be noted that, in the upper cross-sectional view of each of FIGS. 21 and 22, the drawings illustrating an example of the front surface configuration of the semiconductor substrate 11 are superimposed on each other, and the insulating layer 46 is omitted. Lower drawings of FIGS. 21 and 22 each illustrate an example of a cross-sectional configuration of the second substrate 20 in the solid-state imaging device 1 having the configuration of the modification example D. The lower drawings of FIGS. 21 and 22 each exemplify a cross-sectional configuration of a location, of the second substrate 20 of the solid-state imaging device 1 having the configuration of the modification example D, corresponding to a cross-section Sec2 of FIG. 3. It is to be noted that, in the lower cross-sectional view of FIGS. 21 and 22, the drawings illustrating examples of the front surface configurations of the semiconductor substrate 21 and the insulating layer 53 are superimposed on each other, and the insulating layer 52 is omitted. FIG. 21 exemplifies a configuration in which two sets of four sensor pixels 12 of 2×2 are arranged in a second direction H. FIG. 22 exemplifies a configuration in which four sets of four sensor pixels 12 of 2×2 are arranged in a first direction V and the second direction H.

A stacked body including the first substrate 10 and the second substrate 20 includes through-wiring lines 67 and 68 provided inside the interlayer insulating film 51. The stacked body includes one through-wiring line 67 and one through-wiring line 68 for each sensor pixel 12. Each of the through-wiring lines 67 and 68 extends in the normal direction of the semiconductor substrate 21, and is provided to penetrate a location, of the interlayer insulating film 51, including the insulating layer 53. The first substrate 10 and the second substrate 20 are electrically coupled to each other by the through-wiring lines 67 and 68. Specifically, the through-wiring line 67 is electrically coupled to the p-well layer 42 of the semiconductor substrate 11 and to a wiring line inside the second substrate 20. The through-wiring line 68 is electrically coupled to the transfer gate TG and to the pixel drive line 23. As illustrated in FIGS. 21 and 22, the plurality of through-wiring lines 54, a plurality of through-wiring lines 68, and a plurality of through-wiring lines 67 are arranged in line in a strip shape in the first direction V (a vertical direction in FIG. 21 and a horizontal direction in FIG. 22) in a plane of the first substrate 10. It is to be noted that FIGS. 21 and 22 each exemplify the case where the plurality of through-wiring lines 54, the plurality of through-wiring lines 68, and the plurality of through-wiring lines 67 are arranged in line in two rows in the first direction V. The first direction V is parallel to one arrangement direction (e.g., column direction) of two arrangement directions (e.g., row direction and column direction) of the plurality of sensor pixels 12 arranged in matrix. In the four sensor pixels 12 sharing the readout circuit 22, four floating diffusions FD are arranged close to each other with the element separation section 43 interposed therebetween, for example. In the four sensor pixels 12 sharing the readout circuit 22, four transfer gates TG are arranged to surround the four floating diffusions FD, and the four transfer gates TG form, for example, an annular shape.

The insulating layer 53 is configured by a plurality of blocks extending in the first direction V. The semiconductor substrate 21 extends in the first direction V, and is configured by a plurality of island-shaped blocks 21A arranged side by side in the second direction H orthogonal to the first direction V, with the insulating layer 53 interposed therebetween. Each block 21A includes, for example, a plurality of sets of reset transistors RST, amplification transistors AMP, and selection transistors SEL. One readout circuit 22 shared by the four sensor pixels 12 is configured by, for example, the reset transistor RST, the amplification transistor AMP, and the selection transistor SEL, which are inside a region facing the four sensor pixels 12. The one readout circuit 22 shared by the four sensor pixels 12 is configured by, for example, the amplification transistor AMP inside a left adjacent block 21A of the insulating layer 53, and the reset transistor RST and the selection transistor SEL inside a right adjacent block 21A of the insulating layer 53.

Modification Example K

Figure 23:
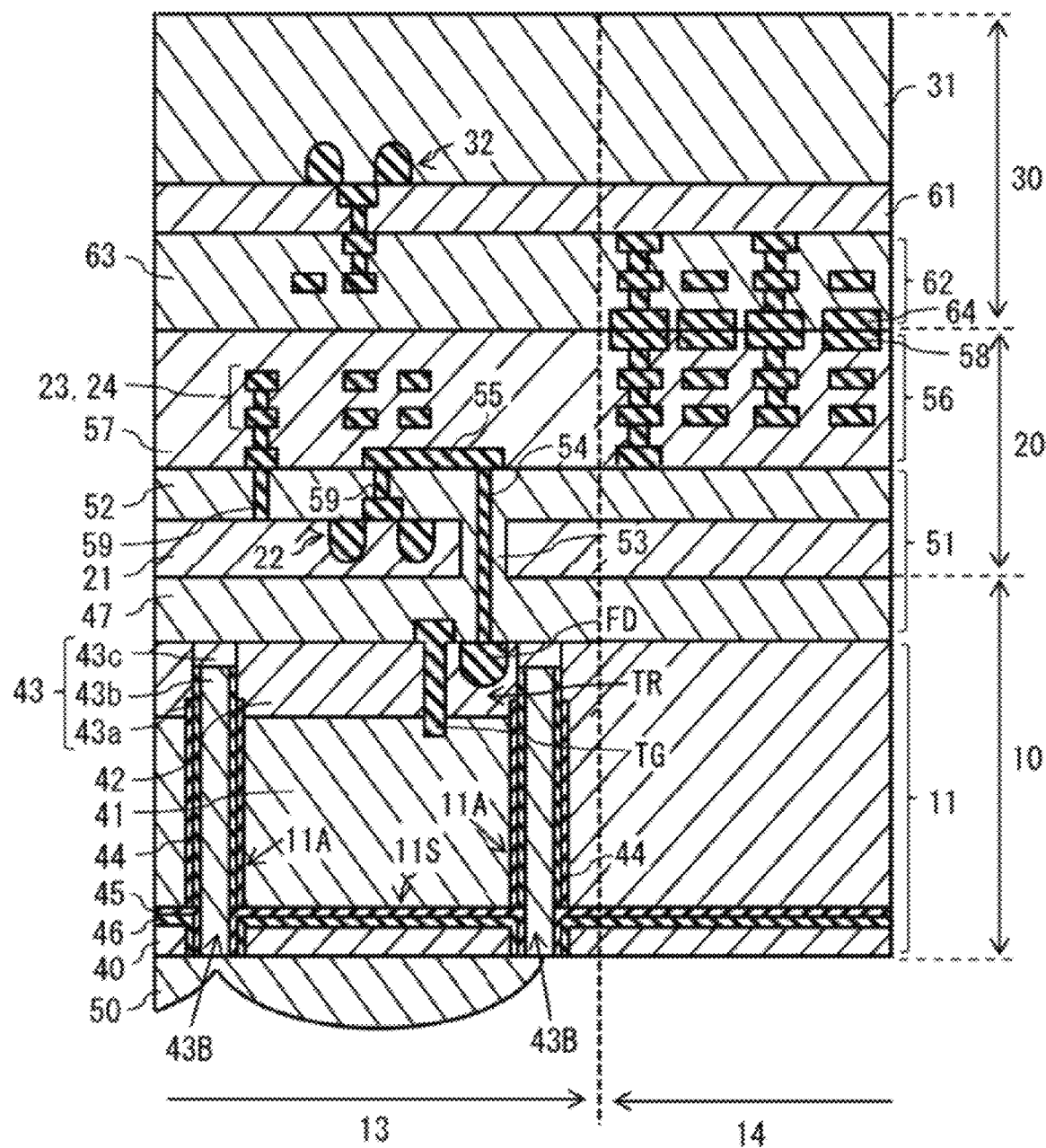
FIG. 23 illustrates a modification example of a cross-sectional configuration in the vertical direction of any of the solid-state imaging devices according to the foregoing embodiment and modification examples thereof.

FIG. 23 illustrates a modification example of the cross-sectional configuration in the vertical direction of the solid-state imaging device 1 according to any of the foregoing embodiment and modification examples thereof. In the present modification example, electric coupling between the second substrate 20 and the third substrate 30 is made in a region facing a peripheral region 14 in the first substrate 10. The peripheral region 14 corresponds to a picture frame region of the first substrate 10, and is provided on the periphery of the pixel region 13. In the present modification example, the second substrate 20 includes the plurality of pad electrodes 58 in a region facing the peripheral region 14, and the third substrate 30 includes the plurality of pad electrodes 64 in a region facing the peripheral region 14. The second substrate 20 and the third substrate 30 are electrically coupled to each other by bonding between the pad electrodes 58 and 64 provided in the region facing the peripheral region 14.

In this manner, in the present modification example, the second substrate 20 and the third substrate 30 are electrically coupled to each other by bonding between the pad electrodes 58 and 64 provided in the region facing the peripheral region 14. This makes it possible to reduce a possibility that miniaturization of an area per pixel may be inhibited, as compared with a case of bonding the pad electrodes 58 and 64 to each other in a region facing the pixel region 13. Thus, it is possible to provide the solid-state imaging device 1 having a chip size equivalent to an existing chip size and having a three-layered structure not inhibiting the miniaturization of an area per pixel.

Modification Example L

Figure 24:
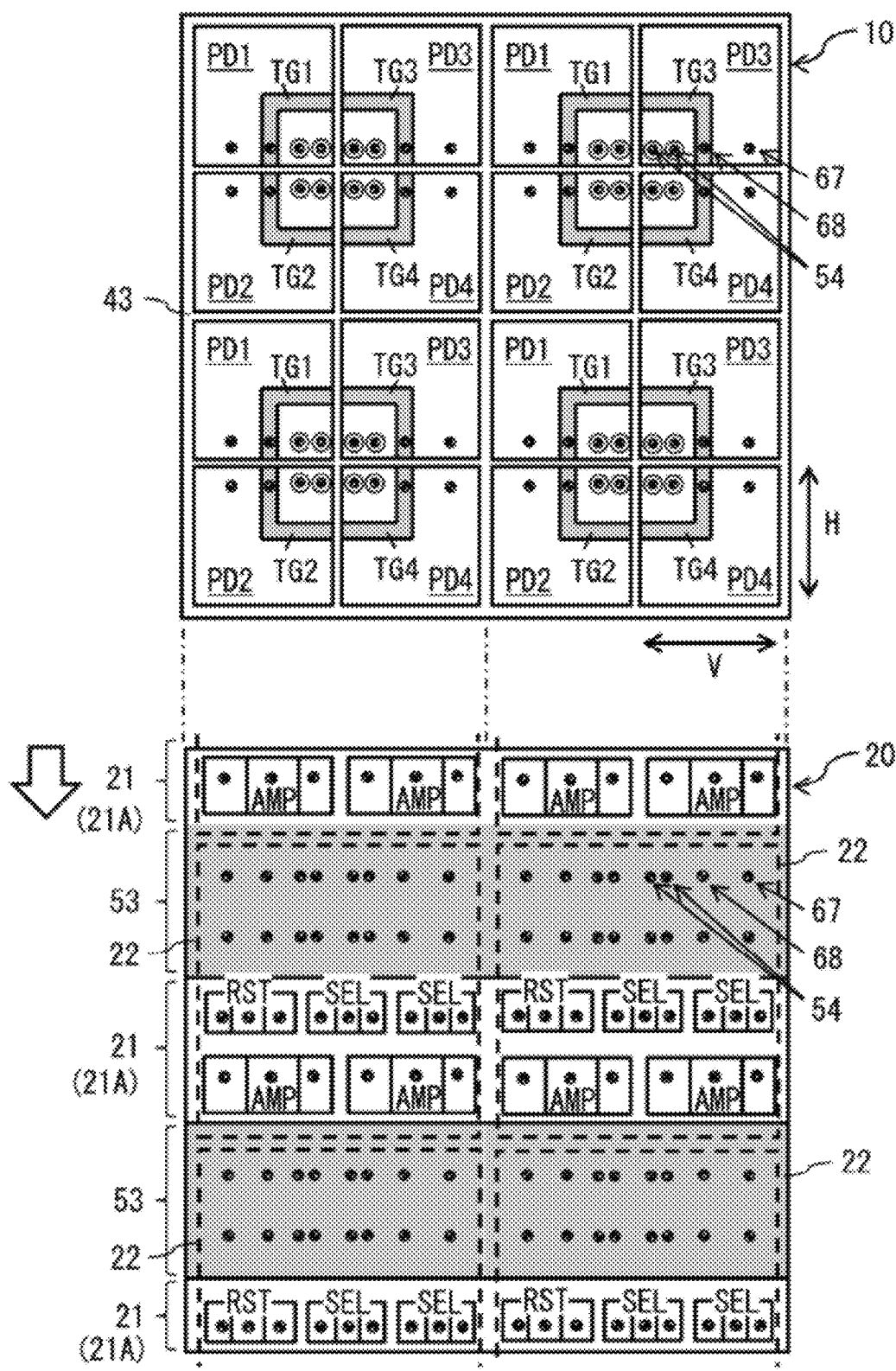
FIG. 24 illustrates a modification example of a cross-sectional configuration in the horizontal direction of any of the solid-state imaging devices having the configurations of FIG. 15, FIG. 21, FIG. 22, and FIG. 23.
Figure 25:
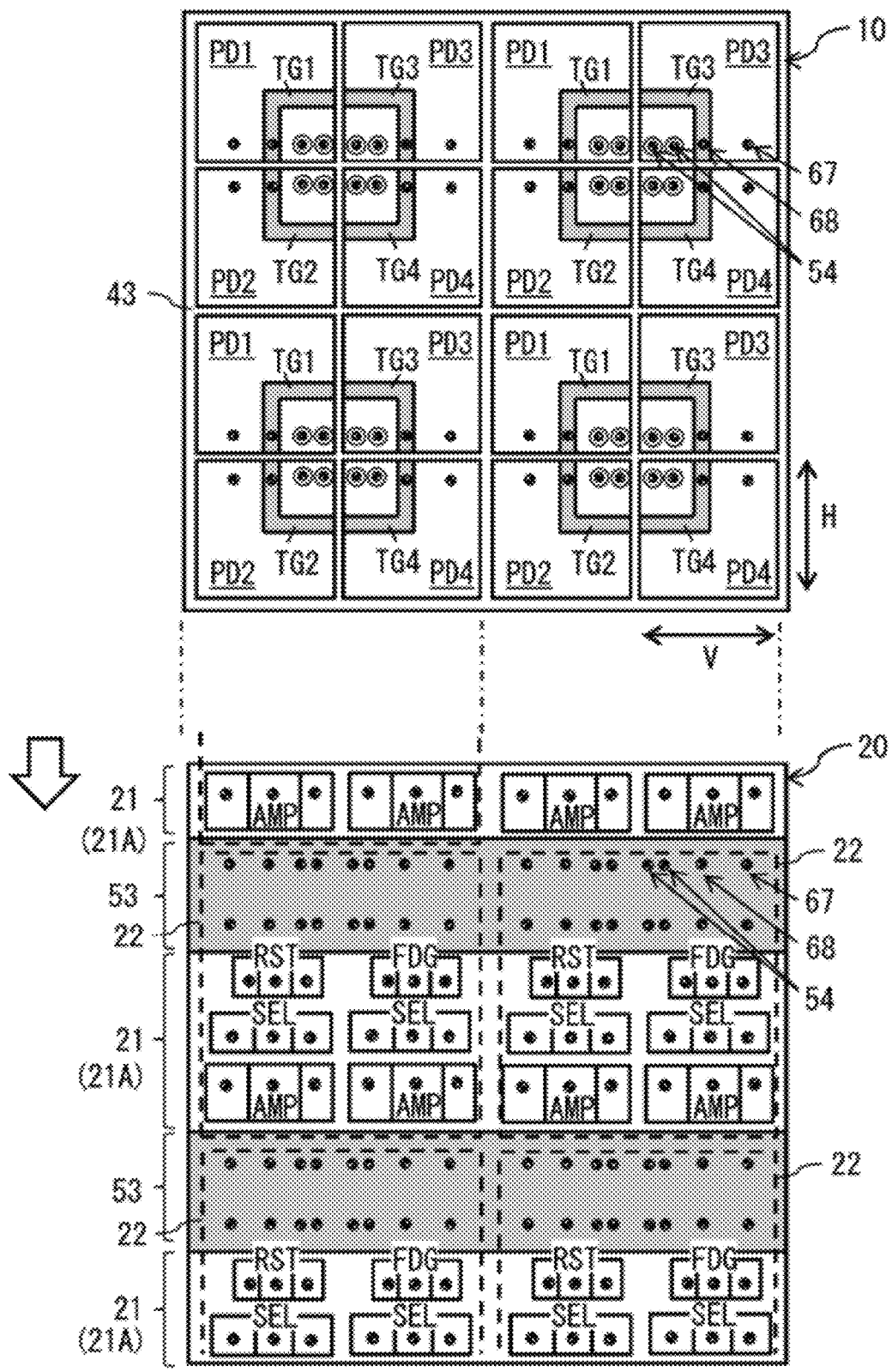
FIG. 25 illustrates a modification example of the cross-sectional configuration in the horizontal direction of any of the solid-state imaging devices having the configurations of FIG. 15, FIG. 21, FIG. 22, and FIG. 23.

FIGS. 24 and 25 each illustrate a modification example of the cross-sectional configuration in the horizontal direction of the solid-state imaging device 1 according to any of the modification examples D, J, and K. Upper drawings in FIGS. 24 and 25 each illustrate a modification example of the cross-sectional configuration of the first substrate 10 in the solid-state imaging device 1 having the configuration of any of the modification examples D, J, and K. The upper drawings of FIGS. 24 and 25 each exemplify a cross-sectional configuration of a location, of the first substrate 10 of the solid-state imaging device 1 having the configuration of any of the modification examples D, J, and K, corresponding to the cross-section Sec1 of FIG. 3. It is to be noted that, in the upper drawings of FIGS. 24 and 25, the drawings illustrating an example of the front surface configuration of the semiconductor substrate 11 are superimposed on each other, and the insulating layer 46 is omitted. Lower drawings of FIGS. 24 and 25 each illustrate a modification example of the cross-sectional configuration of the second substrate 20 in the solid-state imaging device 1 having the configuration of any of the modification examples D, J, and K. The lower drawings of FIGS. 24 and 25 each exemplify a cross-sectional configuration of a location, of the second substrate 20 of the solid-state imaging device 1 having the configuration of any of the modification examples D, J, and K, corresponding to the cross-section Sec2 of FIG. 3. It is to be noted that, in the lower cross-sectional view of FIGS. 24 and 25, the drawings illustrating examples of the front surface configurations of the semiconductor substrate 21 and the insulating layer 53 are superimposed on each other, and the insulating layer 52 is omitted.

As illustrated in FIGS. 24 and 25, the plurality of through-wiring lines 54, the plurality of through-wiring lines 68, and the plurality of through-wiring lines 67 (a plurality of dots arranged in matrix in the drawing) are arranged in line in a strip shape in the first direction V (a horizontal direction in FIGS. 24 and 25) in a plane of the first substrate 10. It is to be noted that FIGS. 24 and 25 each exemplify the case where the plurality of through-wiring lines 54, the plurality of through-wiring lines 68, and the plurality of through-wiring lines 67 are arranged in line in two rows in the first direction V. In the four sensor pixels 12 sharing the readout circuit 22, the four floating diffusions FD are arranged close to each other with the element separation section 43 interposed therebetween, for example. In the four sensor pixels 12 sharing the readout circuit 22, four transfer gates TG (TG1, TG2, TG3, and TG4) are arranged to surround the four floating diffusions FD, and the four transfer gates TG form, for example, an annular shape.

The insulating layer 53 is configured by a plurality of blocks extending in the first direction V. The semiconductor substrate 21 extends in the first direction V, and is configured by the plurality of island-shaped blocks 21A arranged side by side in the second direction H orthogonal to the first direction V, with the insulating layer 53 interposed therebetween. Each block 21A includes, for example, the reset transistor RST, the amplification transistor AMP, and the selection transistor SEL. One readout circuit 22 shared by the four sensor pixels 12 is not arranged to squarely face the four sensor pixels 12, for example, and is arranged to be shifted in the second direction H.

In FIG. 24, the one readout circuit 22 shared by the four sensor pixels 12 is configured by the reset transistor RST, the amplification transistor AMP, and the selection transistor SEL, which are inside a region, of the second substrate 20, shifted in the second direction H from the region facing the four sensor pixels 12. The one readout circuit 22 shared by the four sensor pixels 12 is configured by, for example, the amplification transistor AMP, the reset transistor RST, and the selection transistor SEL inside one block 21A.

In FIG. 25, the one readout circuit 22 shared by the four sensor pixels 12 is configured by the reset transistor RST, the amplification transistor AMP, the selection transistor SEL, and an FD transfer transistor FDG, which are inside a region, of the second substrate 20, shifted in the second direction H from the region facing the four sensor pixels 12. The one readout circuit 22 shared by the four sensor pixels 12 is configured by, for example, the amplification transistor AMP, the reset transistor RST, the selection transistor SEL, and the FD transfer transistor FDG inside the one block 21A.

In the present modification example, the one readout circuit 22 shared by the four sensor pixels 12 is not arranged to squarely face the four sensor pixels 12, for example, and is arranged to be shifted in the second direction H from a position squarely facing the four sensor pixels 12. In such a case, it may be possible to shorten a wiring line 25, or it may be possible to omit the wiring line 25 and to configure a source of the amplification transistor AMP and a drain of the selection transistor SEL using an impurity region in common. As a result, it is possible to reduce a size of the readout circuit 22 or to increase a size of another location inside the readout circuit 22.

Modification Example M

Figure 26:
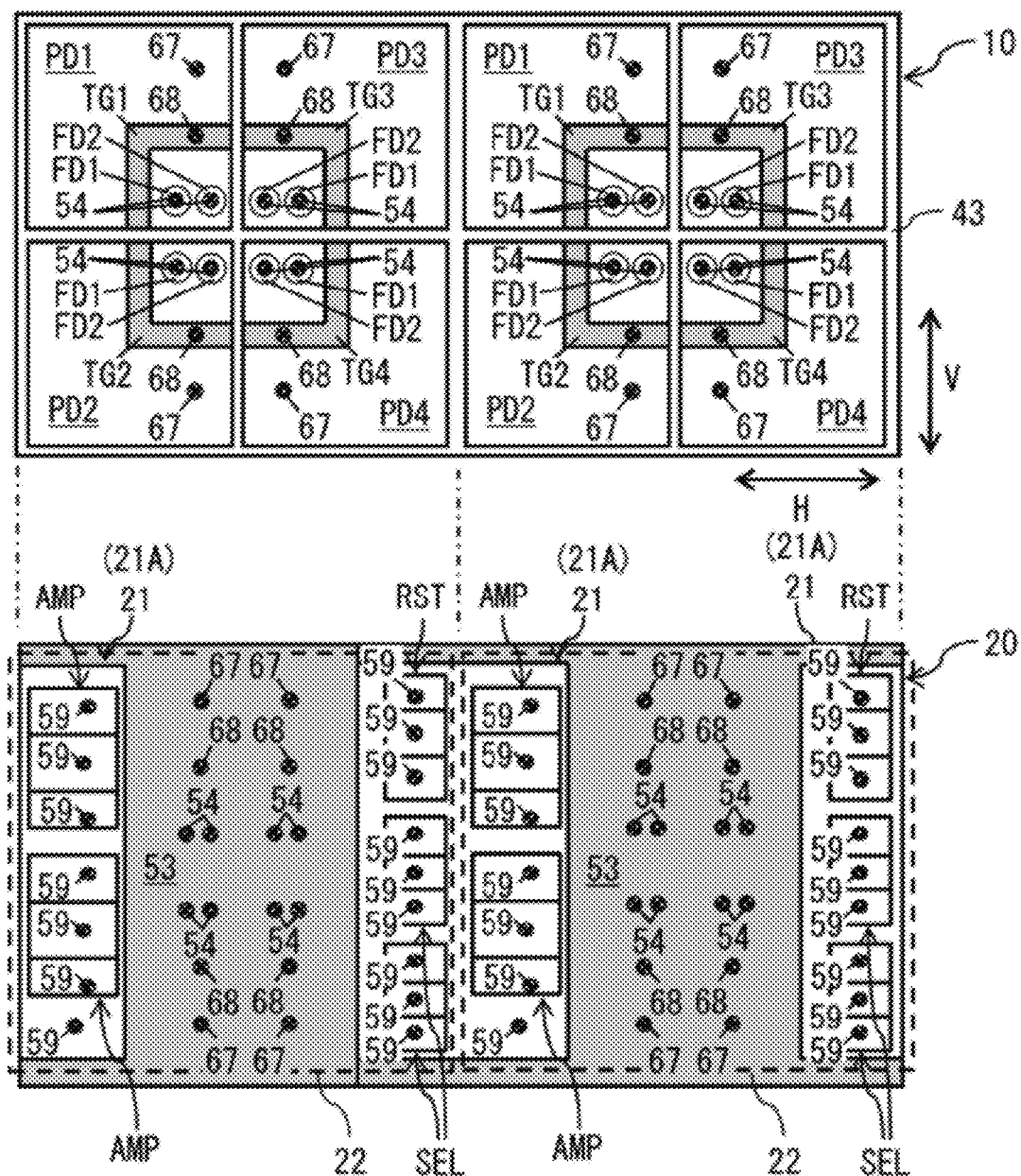
FIG. 26 illustrates a modification example of a cross-sectional configuration in the horizontal direction of any of the solid-state imaging devices having the configurations of FIG. 15, FIG. 21, FIG. 22, and FIG. 23 to FIG. 25.

FIG. 26 illustrates a modification example of the cross-sectional configuration in the horizontal direction of the solid-state imaging device 1 according to any of the modification examples D, J, K, and L. An upper drawing in FIG. 26 illustrates an example of the cross-sectional configuration of the first substrate 10 in the solid-state imaging device 1 having the configuration of any of the modification examples D, J, K, and L. The upper drawing of FIG. 26 exemplifies a cross-sectional configuration of a location, of the first substrate 10 of the solid-state imaging device 1 having the configuration of any of the modification examples D, J, K, and L, corresponding to the cross-section Sec1 of FIG. 3. It is to be noted that, in the upper cross-sectional view of FIG. 26, the drawings illustrating an example of the front surface configuration of the semiconductor substrate 11 are superimposed on each other, and the insulating layer 46 is omitted. A lower drawing of FIG. 26 illustrates an example of the cross-sectional configuration of the second substrate 20 in the solid-state imaging device 1 having the configuration of any of the modification examples D, J, K, and L. The lower drawing of FIG. 26 exemplifies a cross-sectional configuration of a location, of the second substrate 20 of the solid-state imaging device 1 having the configuration of any of the modification examples D, J, K, and L, corresponding to the cross-section Sec2 of FIG. 3. It is to be noted that, in the lower cross-sectional view of FIG. 26, the drawings illustrating examples of the front surface configurations of the semiconductor substrate 21 and the insulating layer 53 are superimposed on each other, and the insulating layer 52 is omitted. FIG. 26 exemplifies a configuration in which two sets of four sensor pixels 12 of 2×2 are arranged in the second direction H.

In the present modification example, the semiconductor substrate 21 is configured by the plurality of island-shaped blocks 21A arranged side by side in the first direction V and the second direction H, with the insulating layer 53 interposed therebetween. Each block 21A includes, for example, a set of the reset transistor RST, the amplification transistor AMP, and the selection transistor SEL. In such a case, it is possible to cause the insulating layer 53 to suppress a crosstalk between the readout circuits 22 adjacent to each other, thus making it possible to suppress image quality degradation due to a decrease in resolution and color mixing on a reproduced image.

Modification Example N

Figure 27:
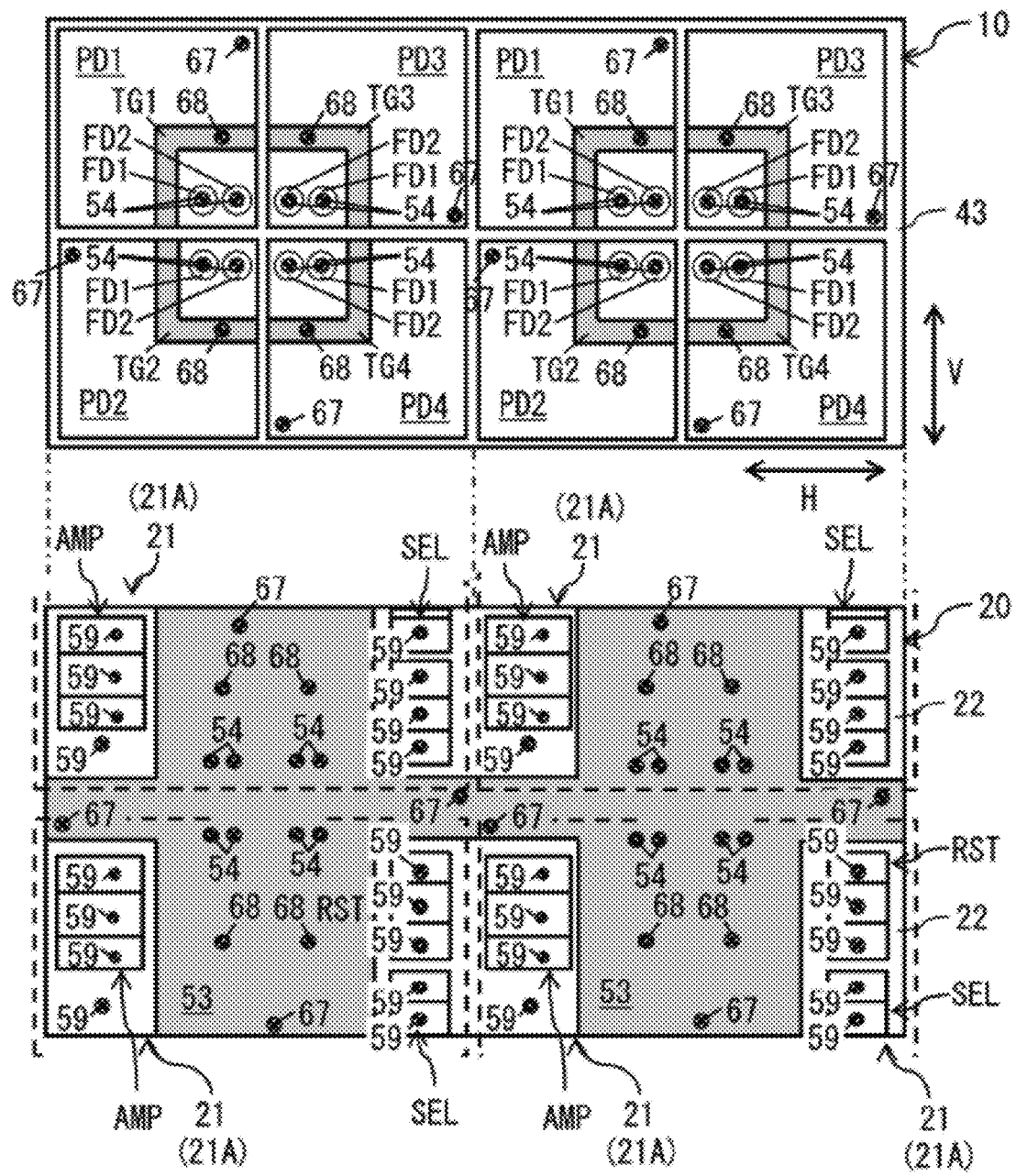
FIG. 27 illustrates a modification example of a cross-sectional configuration in the horizontal direction of any of the solid-state imaging devices having the configurations of FIG. 15, FIG. 21, FIG. 22, and FIG. 23 to FIG. 26.

FIG. 27 illustrates a modification example of the cross-sectional configuration in the horizontal direction of the solid-state imaging device 1 according to any of the modification examples D, J, K, L, and M. An upper drawing in FIG. 27 illustrates an example of the cross-sectional configuration of the first substrate 10 in the solid-state imaging device 1 having the configuration of any of the modification examples D, J, K, L, and M. The upper drawing of FIG. 27 exemplifies a cross-sectional configuration of a location, of the first substrate 10 of the solid-state imaging device 1 having the configuration of any of the modification examples D, J, K, L, and M, corresponding to the cross-section Sect of FIG. 3. It is to be noted that, in the upper cross-sectional view of FIG. 27, the drawings illustrating an example of the front surface configuration of the semiconductor substrate 11 are superimposed on each other, and the insulating layer 46 is omitted. A lower drawing of FIG. 27 illustrates an example of the cross-sectional configuration of the second substrate 20 in the solid-state imaging device 1 having the configuration of any of the modification examples D, J, K, L, and M. The lower drawing of FIG. 27 exemplifies a cross-sectional configuration of a location, of the second substrate 20 of the solid-state imaging device 1 having the configuration of any of the modification examples D, J, K, L, and M, corresponding to the cross-section Sec2 of FIG. 3. It is to be noted that, in the lower cross-sectional view of FIG. 27, the drawings illustrating examples of the front surface configurations of the semiconductor substrate 21 and the insulating layer 53 are superimposed on each other, and the insulating layer 52 is omitted. FIG. 27 exemplifies a configuration in which two sets of four sensor pixels 12 of 2×2 are arranged in the second direction H.

In the present modification example, the one readout circuit 22 shared by the four sensor pixels 12 is not arranged to squarely face the four sensor pixels 12, for example, and is arranged to be shifted in the first direction V. In the present modification example, similarly to the modification example F, the semiconductor substrate 21 is further configured by the plurality of island-shaped blocks 21A arranged side by side in the first direction V and the second direction H, with the insulating layer 53 interposed therebetween. Each block 21A includes, for example, a set of the reset transistor RST, the amplification transistor AMP, and the selection transistor SEL. In the present modification example, the plurality of through-wiring lines 67 and the plurality of through-wiring lines 54 are further arranged also in the second direction H. Specifically, the plurality of through-wiring lines 67 is disposed between the four through-wiring lines 54 sharing a certain readout circuit 22 and the four through-wiring lines 54 sharing another readout circuit 22 adjacent to the certain readout circuit 22 in the second direction H. In such a case, it is possible to cause the insulating layer 53 and the through-wiring line 67 to suppress a crosstalk between the readout circuits 22 adjacent to each other, thus making it possible to suppress image quality degradation due to a decrease in resolution and color mixing on a reproduced image.

Modification Example O

Figure 28:
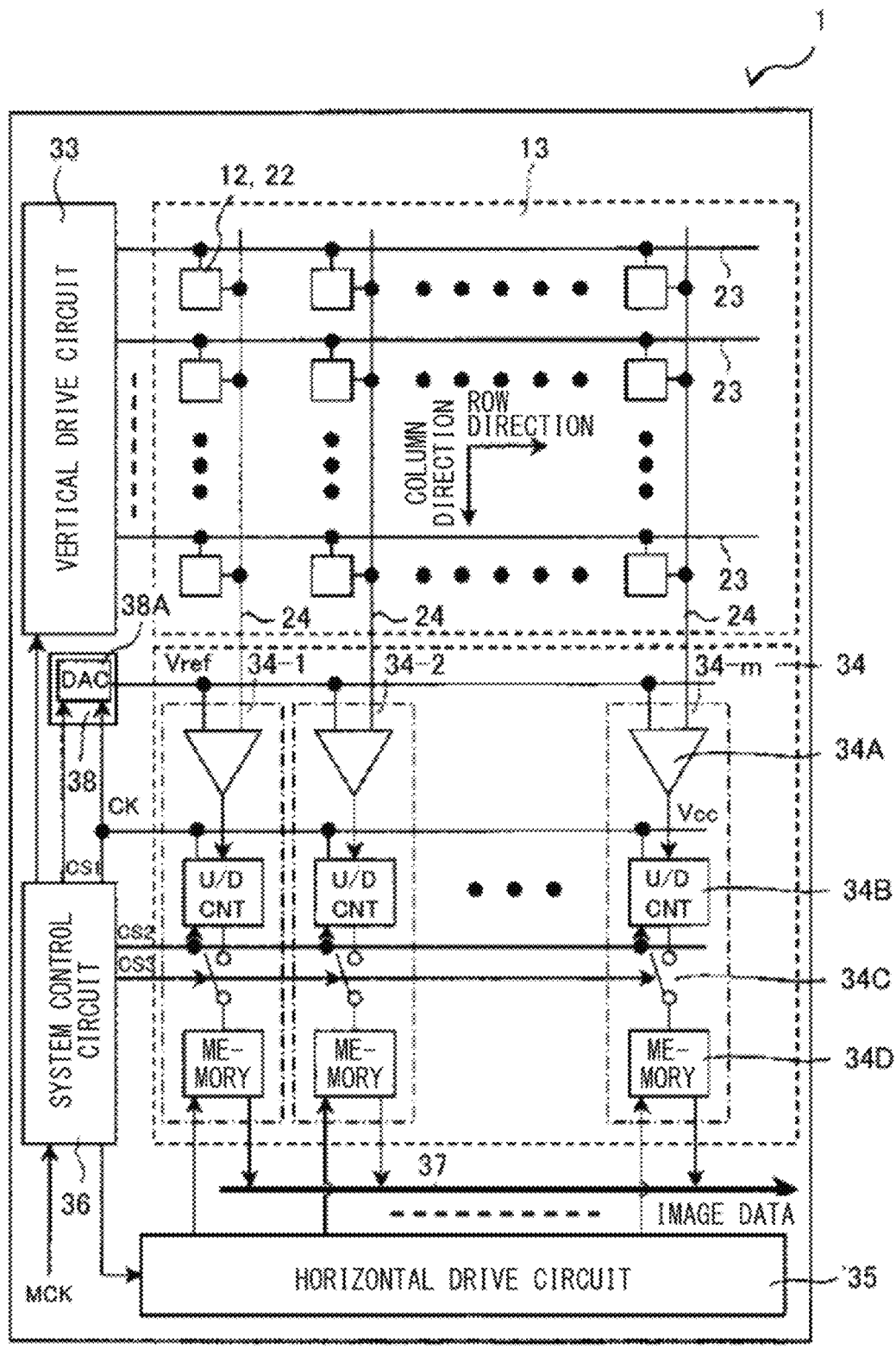
FIG. 28 illustrates an example of a circuit configuration of an imaging apparatus provided with any of the solid-state imaging devices according to the foregoing embodiment and modification examples thereof.

FIG. 28 illustrates an example of a circuit configuration of the solid-state imaging device 1 according to any of the foregoing embodiment and modification examples thereof. The solid-state imaging device 1 according to the present modification example is a CMOS image sensor mounted with a column-parallel ADC.

As illustrated in FIG. 28, the solid-state imaging device 1 according to the present modification example is configured to include the vertical drive circuit 33, the column signal processing circuit 34, a reference voltage supply section 38, the horizontal drive circuit 35, a horizontal output line 37, and the system control circuit 36, in addition to the pixel region 13 in which the plurality of sensor pixels 12 each including a photoelectric conversion element are two-dimensionally arranged in matrix (matrix shape).

In this system configuration, on the basis of a master clock MCK, the system control circuit 36 generates a clock signal, a control signal, or the like that serves as a criterion for an operation of the vertical drive circuit 33, the column signal processing circuit 34, the reference voltage supply section 38, the horizontal drive circuit 35, and the like, and provides the clock signal, the control signal, or the like to the vertical drive circuit 33, the column signal processing circuit 34, the reference voltage supply section 38, the horizontal drive circuit 35, and the like.

In addition, the vertical drive circuit 33 is formed in the first substrate 10 together with each of the sensor pixels 12 of the pixel region 13, and is further formed in the second substrate 20, as well, in which the readout circuit 22 is formed. The column signal processing circuit 34, the reference voltage supply section 38, the horizontal drive circuit 35, the horizontal output line 37 and the system control circuit 36 are formed in the third substrate 30.

It may be possible to use, as the sensor pixel 12, for example, a configuration including, in addition to the photodiode PD, the transfer transistor TR that transfers charges obtained by photoelectric conversion in the photodiode PD to the floating diffusion FD, although illustration is omitted here. In addition, it may be possible to use, as the readout circuit 22, for example, a three-transistor configuration including the reset transistor RST that controls an electric potential of the floating diffusion FD, the amplification transistor AMP that outputs a signal corresponding to an electric potential of the floating diffusion FD, and the selection transistor SEL for selecting a pixel, although illustration is omitted here.

In the pixel region 13, the sensor pixels 12 are two-dimensionally arranged; with respect to this pixel arrangement of m-row and n-column, the pixel drive lines 23 are wired for respective rows, and the vertical signal lines 24 are wired for respective columns. Each one end of the plurality of pixel drive lines 23 is coupled to a corresponding output end of the rows of the vertical drive circuit 33. The vertical drive circuit 33 is configured by a shift register or the like, and controls row address and row scanning of the pixel region 13 via the plurality of pixel drive lines 23.

The column signal processing circuit 34 includes, for example, ADCs (analog-to-digital conversion circuits) 34-1 to 34-$m$ provided for respective pixel columns, i.e., for the respective vertical signal lines 24 of the pixel region 13, and converts analog signals outputted for respective columns from the sensor pixels 12 of the pixel region 13 into digital signals for outputting.

The reference voltage supply section 38 includes, for example, a DAC (digital-to-analog conversion circuit) 38A as a means to generate a reference voltage Vref of a so-called ramp (RAMP) waveform having a level that changes in an inclined manner as time elapses. It is to be noted that the means to generate the reference voltage Vref of the ramp waveform is not limited to the DAC 38A.

Under the control of a control signal CS1 provided from the system control circuit 36, the DAC 38A generates the reference voltage Vref of the ramp waveform on the basis of a clock CK provided from this system control circuit 36 to supply the generated reference voltage Vref to the ADCs 34-1 to 34-$m$ of the column signal processing circuit 34.

It is to be noted that each of the ADCs 34-1 to 34-$m$ is configured to selectively perform an AD conversion operation corresponding to each operation mode of a normal frame rate mode in a progressive scanning system for reading information on all of the sensor pixels 12, and a high-speed frame rate mode for setting exposure time of the sensor pixel 12 to 1/N to increase a frame rate by N times, e.g., by twice, as compared with the time of the normal frame rate mode. The switching between the operation modes is executed by controls performed by control signals CS2 and CS3 provided from the system control circuit 36. In addition, instruction information for switching between the normal frame rate mode and the high-speed frame rate mode is provided from an external system controller (unillustrated) to the system control circuit 36.

All of the ADCs 34-1 to 34-*m* have the same configuration; description is given here referring to the example of the ADC 34-*m*. The ADC 34-*m* is configured to include a comparator 34A, an up/down counter (referred to as U/D CNT in the drawing) 34B as a number-counting means, a transfer switch 34C, and a memory 34D.

The comparator 34A compares a signal voltage Vx of the vertical signal line 24 corresponding to a signal outputted from each sensor pixel 12 of an n-th column of the pixel region 13 and the reference voltage Vref of the ramp waveform supplied from the reference voltage supply section 38 with each other. For example, when the reference voltage Vref is larger than the signal voltage Vx, an output Vco becomes an "H" level, whereas, when the reference voltage Vref is equal to or less than the signal voltage Vx, the output Vco becomes an "L" level.

The up/down counter 34B is an asynchronous counter; under the control of the control signal CS2 provided from the system control circuit 36, the up/down counter 34B is provided with the clock CK from the system control circuit 36 simultaneously with the DAC 18A, and performs down (DOWN)-counting or up (UP)-counting in synchronization with the clock CK to thereby measure a comparison period from the start of a comparison operation to the end of the comparison operation in the comparator 34A.

Specifically, in the normal frame rate mode, when performing a reading operation of signals from one sensor pixel 12, the down-counting is performed upon a first reading operation to thereby measure comparison time upon the first reading, whereas the up-counting is performed upon a second reading operation to measure comparison time upon the second reading.

Meanwhile, in the high-speed frame rate mode, while holding a count result for the sensor pixels 12 of a certain row as it is, the down-counting is subsequently performed for the sensor pixels 12 of the next row upon the first reading operation from the previous count result to thereby measure the comparison time upon the first reading, and the up-counting is performed upon the second reading operation to thereby measure the comparison time upon the second reading.

Under the control of the control signal CS3 provided from the system control circuit 36, the transfer switch 34C, in the normal frame rate mode, is brought into an ON (closed) state upon completion of the counting operation of the up/down counter 34B for the sensor pixels 12 of the certain row to transfer, to the memory 34D, the count results of the up/down counter 34B.

Meanwhile, for example, in the high-speed frame rate of N=2, an OFF (open) state remains upon completion of the counting operation of the up/down counter 34B for the sensor pixels 12 of the certain row, and subsequently an ON state is obtained upon completion of the counting operation of the up/down counter 34B for the sensor pixels 12 of the next row to transfer, to the memory 34D, the count results of the up/down counter 34B for the vertical two pixels.

In this manner, analog signals supplied for respective columns from the respective sensor pixels 12 of the pixel region 13 via the vertical signal lines 24 are converted into N-bit digital signals by respective operations of the comparators 34A and the up/down counters 34B in the ADCs 34-1 to 34-*m*, and are stored in the memories 34D.

The horizontal drive circuit 35 is configured by a shift register or the like, and controls column address and column scanning of the ADCs 34-1 to 34-*m* in the column signal processing circuit 34. Under the control of the horizontal drive circuit 35, the N-bit digital signals having been subjected to the AD conversion in the respective ADCs 34-1 to 34-*m* are read in order to the horizontal output line 37, and are outputted as imaging data via the horizontal output line 37.

It is to be noted that it may also be possible to provide, in addition to the above-described components, a circuit, etc. that performs various types of signal processing on imaging data to be outputted via the horizontal output line 37, although no particular illustration is given because there is no direct relationship with the present disclosure.

In the solid-state imaging device 1 mounted with the column-parallel ADC according to the present modification example having the above configuration, the count results of the up/down counter 34B are able to be selectively transferred to the memory 34D via the transfer switch 34C. This makes it possible to control the counting operation of the up/down counter 34B and the reading operation of the count results of the up/down counter 34B to the horizontal output line 37 independently of each other.

Modification Example P

Figure 29:
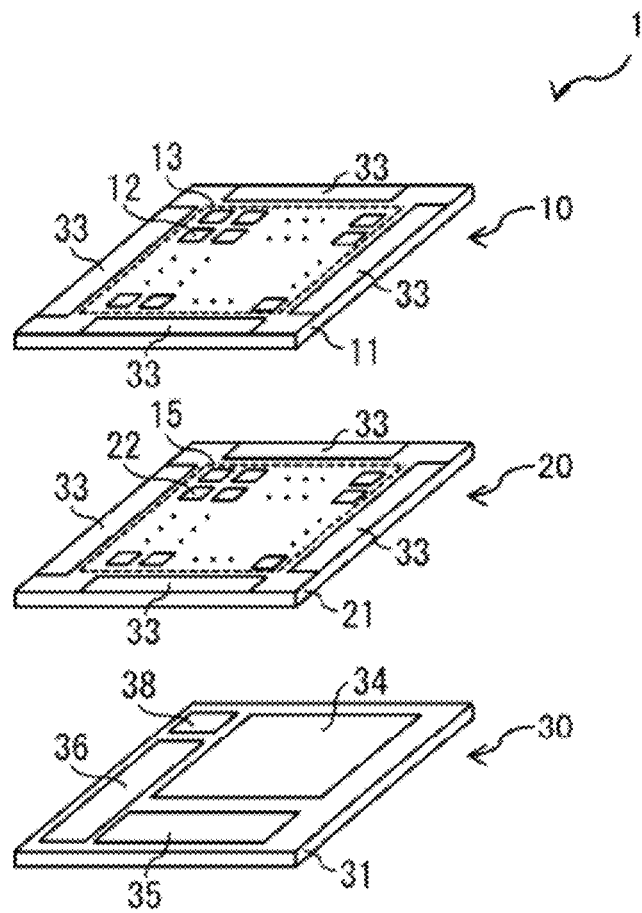
FIG. 29 illustrates an example of a configuration of the solid-state imaging device of FIG. 28, in which three substrate are stacked.

FIG. 29 illustrates an example of a configuration of the solid-state imaging device 1 of FIG. 28, in which three substrates (first substrate 10, second substrate 20, and third substrate 30) are stacked. In the present modification example, the first substrate 10 has a middle part where the pixel region 13 including the plurality of sensor pixels 12 is formed, with the vertical drive circuit 33 being formed around the pixel region 13. In addition, the second substrate 20 has a middle part where a readout circuit region 15 including the plurality of readout circuits 22 is formed, with the vertical drive circuit 33 being formed around the readout circuits region 15. In the third substrate 30, the column signal processing circuit 34, the horizontal drive circuit 35, the system control circuit 36, the horizontal output line 37, and the reference voltage supply section 38 are formed. This eliminates an increase in a chip size and inhibition of miniaturization of an area per pixel due to the structure of electrically coupling substrates to each other, similarly to the foregoing embodiment and modification examples thereof. As a result, it is possible to provide the solid-state imaging device 1 having a chip size equivalent to an existing chip size and having a three-layered structure not inhibiting the miniaturization of an area per pixel. It is to be noted that the vertical drive circuit 33 may be formed only in the first substrate 10 or may be formed only in the second substrate 20.

Modification Example Q

Figure 30:
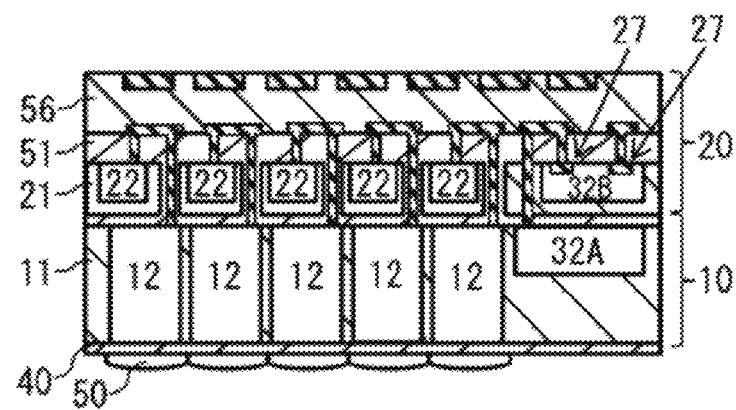
FIG. 30 illustrates an example of a logic circuit formed separately in a substrate including a sensor pixel and a substrate including a readout circuit.

FIG. 30 illustrates a modification example of the cross-sectional configuration of the solid-state imaging device 1 according to any of the foregoing embodiment and modification examples thereof. In the foregoing embodiment and modification examples thereof, the third substrate 30 may be omitted, and the logic circuits 32 provided in the third substrate 30 may be formed separately in the first substrate 10 and the second substrate 20, for example, as illustrated in FIG. 30. At this time, a circuit 32A, of the logic circuit 32, provided on side of the first substrate 10 is provided with a transistor having a gate structure, in which a high dielectric constant film including a material (e.g., high-k) that is able to withstand a high-temperature process and a metal gate electrode are stacked. Meanwhile, in a circuit 32B provided on side of the second substrate 20, a low-resistance region 27 is formed, which includes a silicide formed using a Salicide (Self Aligned Silicide) process such as $CoSi_2$ and NiSi, on a front surface of an impurity diffusion region in contact with a source electrode and a drain electrode. The low-resistance region 27 including a silicide is formed by a compound of a semiconductor substrate material and a metal. This makes it possible to use a high-temperature process such as thermal oxidation when forming the sensor pixel 12. In addition, it is possible to reduce contact resistance in a case of providing the low-resistance region 27 including a silicide on the front surface of the impurity diffusion region in contact with a source electrode and a drain electrode in the circuit 32B, of the logic circuit 32, provided on the side of the second substrate 20. As a result, it is possible to increase the speed of an arithmetic operation in the logic circuit 32.

Figure 31:
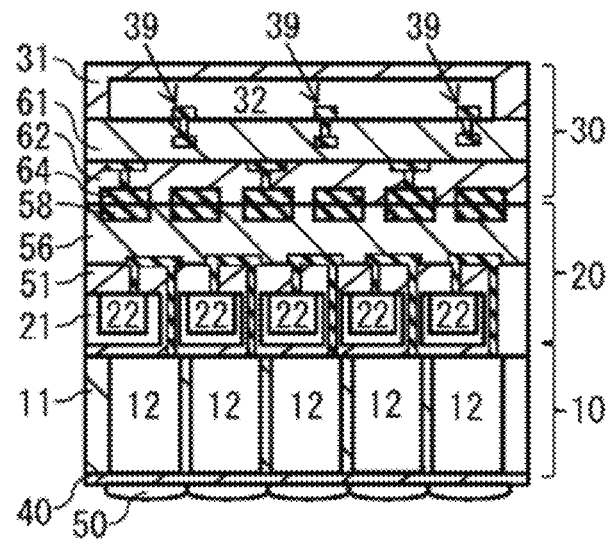
FIG. 31 illustrates an example in which a logic circuit is formed in a third substrate.

FIG. 31 illustrates a modification example of the cross-sectional configuration of the solid-state imaging device 1 according to any of the foregoing embodiment and modification examples thereof. In the logic circuit 32 provided in the third substrate 30 according to the foregoing embodiment and modification examples thereof, a low-resistance region 39 including a silicide formed by using the Salicide (Self Aligned Silicide) process such as $CoSi_2$ and NiSi may be formed on the front surface of the impurity diffusion region in contact with the source electrode and the drain electrode. This makes it possible to use a high-temperature process such as thermal oxidation when forming the sensor pixel 12. In addition, it is possible to reduce contact resistance in a case of providing the low-resistance region 39 including a silicide on the front surface of the impurity diffusion region in contact with the source electrode and the drain electrode in the logic circuit 32. As a result, it is possible to increase the speed of an arithmetic operation in the logic circuit 32.

It is to be noted that, in the foregoing embodiment and modification examples thereof, the electric conductivity type may be opposite. For example, in the descriptions of the foregoing embodiment and modification examples thereof, the p-type may be read as the n-type, and the n-type may be read as the p-type. Even in such a case, it is possible to obtain effects similar to those of the foregoing embodiment and modification examples thereof.

3. Application Example

FIG. 32 illustrates an example of a schematic configuration of an imaging system 2 including the solid-state imaging device 1 according to any of the foregoing embodiment and modification examples thereof.

The imaging system 2 is an electronic apparatus including, for example, a solid-state imaging apparatus such as a digital still camera or a video camera, or a portable terminal apparatus such as a smartphone or a tablet-type terminal. The imaging system 2 includes, for example, the solid-state imaging device 1 according to any of the foregoing embodiment and modification examples thereof, a DSP circuit 141, a frame memory 142, a display unit 143, a storage unit 144, an operation unit 145, and a power source unit 146. In the imaging system 2, the solid-state imaging device 1 according to any of the foregoing embodiment and modification examples thereof, the DSP circuit 141, the frame memory 142, the display unit 143, the storage unit 144, the operation unit 145, and the power source unit 146 are coupled to one another via a bus line 147.

The solid-state imaging device 1 according to any of the foregoing embodiment and modification examples thereof outputs image data corresponding to incident light. The DSP circuit 141 is a signal processing circuit that processes a signal (image data) outputted from the solid-state imaging device 1 according to any of the foregoing embodiment and modification examples thereof. The frame memory 142 temporarily holds the image data processed by the DSP circuit 141 in a frame unit. The display unit 143 includes, for example, a panel-type display device such as a liquid crystal panel or an organic EL (Electro Luminescence) panel, and displays a moving image or a still image captured by the solid-state imaging device 1 according to any of the foregoing embodiment and modification examples thereof. The storage unit 144 records image data of a moving image or a still image captured by the solid-state imaging device 1 according to any of the foregoing embodiment and modification examples thereof in a recording medium such as a semiconductor memory or a hard disk. The operation unit 145 issues an operation command for various functions of the imaging system 2 in accordance with an operation by a user. The power source unit 146 appropriately supplies various types of power for operation to the solid-state imaging device 1 according to any of the foregoing embodiment and modification examples thereof, the DSP circuit 141, the frame memory 142, the display unit 143, the storage unit 144, and the operation unit 145 which are supply targets.

Next, description is given of an imaging procedure in the imaging system 2.

FIG. 33 illustrates an example of a flowchart of an imaging operation in the imaging system 2. A user instructs start of imaging by operating the operation unit 145 (step S101). Then, the operation unit 145 transmits an imaging command to the solid-state imaging device 1 (step S102). The solid-state imaging device 1 (specifically, the system control circuit 36) executes imaging in a predetermined imaging method upon receiving the imaging command (step S103).

The solid-state imaging device 1 outputs image data obtained by the imaging to the DSP circuit 141. As used herein, the image data refers to data for all pixels of pixel signals generated on the basis of charges temporarily held in the floating diffusion FD. The DSP circuit 141 performs predetermined signal processing (e.g., noise reduction processing, etc.) on the basis of the image data inputted from the solid-state imaging device 1 (step S104). The DSP circuit 141 causes the frame memory 142 to hold the image data having been subjected to the predetermined signal processing, and the frame memory 142 causes the storage unit 144 to store the image data (step S105). In this manner, the imaging in the imaging system 2 is performed.

In the present application example, the solid-state imaging device 1 according to any of the foregoing embodiment and modification examples thereof is applied to the imaging system 2. This enables miniaturization or higher definition of the solid-state imaging device 1, thus making it possible to provide the miniaturized or high-definition imaging system 2

4. Examples of Practical Applications

Practical Application Example 1

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the solid-state imaging device 1 according to any of the foregoing embodiment and modification examples thereof is applicable to the imaging section 12031. The application of the technology according to an embodiment of the present disclosure to the imaging section 12031 allows for a high-definition captured image with less noise, thus making it possible to perform highly accurate control utilizing the captured image in the mobile body control system.

Practical Application Example 2

FIG. 36 is a view depicting an example of a schematic configuration of an endoscopic surgery system to which the technology according to an embodiment of the present disclosure (present technology) can be applied.

In FIG. 36, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 37 is a block diagram depicting an example of a functional configuration of the camera head 11102 and the CCU 11201 depicted in FIG. 36.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is suitably applicable to, for example, the image pickup unit 11402 provided in the camera head 11102 of the endoscope 11100, among the configurations described above. Applying the technology according to an embodiment of the present disclosure to the image pickup unit 11402 enables miniaturization or higher definition of the image pickup unit 11402, thus making it possible to provide the miniaturized or high-definition endoscope 11100.

Although the description has been given hereinabove of the present disclosure with reference to the embodiment and modification examples thereof, the application example, and the practical application examples, the present disclosure is not limited to the foregoing embodiment, etc., and various modifications may be made. It is to be noted that the effects described herein are merely illustrative. The effects of the present disclosure are not limited to those described herein. The present disclosure may have other effects than those described herein.

In addition, the present disclosure may also have the following configurations.

(1)

A solid-state imaging device including:
a photoelectric conversion section;
a first signal path including a first floating diffusion and a first amplification transistor;
a second signal path including a second floating diffusion and a second amplification transistor;
a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section;
a first substrate in which at least the photoelectric conversion section is formed, among the photoelectric conversion section, the first floating diffusion, the first amplification transistor, the second floating diffusion, the second amplification transistor, and the mode-switching switch section; and
a second substrate which is stacked on the first substrate, and in which at least the second amplification transistor is formed, among the photoelectric conversion section, the first floating diffusion, the first amplification transistor, the second floating diffusion, the second amplification transistor, and the mode-switching switch section.

(2)

The solid-state imaging device according to (1), in which
the photoelectric conversion section, the first floating diffusion, the second floating diffusion, and the mode-switching switch section are formed in the first substrate, and
the first amplification transistor and the second amplification transistor are formed in the second substrate.

(3)

The solid-state imaging device according to (1), in which
the photoelectric conversion section, the first floating diffusion, the first amplification transistor, the second floating diffusion, and the mode-switching switch section are formed in the first substrate, and
the second amplification transistor is formed in the second substrate.

(4)

The solid-state imaging device according to (1), in which
the photoelectric conversion section is formed in the first substrate, and
the first floating diffusion, the first amplification transistor, the second floating diffusion, the second amplification transistor, and the mode-switching switch section are formed in the second substrate.

(5)

The solid-state imaging device according to any one of (1) to (4), in which an electrode of the transistor formed in the second substrate includes a silicide.

(6)

The solid-state imaging device according to any one of (1) to (5), further including a drive circuit that changes a drive current depending on magnitude of a size of the transistor that is converted by switching of the mode-switching switch section.

(7)

A solid-state imaging device including:
a photoelectric conversion section;
a first signal path including a first floating diffusion and a first amplification transistor;
a second signal path including a second floating diffusion and a second amplification transistor;
a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section;
a first substrate in which the photoelectric conversion section and the first floating diffusion are formed;
a second substrate which is stacked on the first substrate, and in which the first amplification transistor, the second floating diffusion, and the mode-switching switch section are formed; and
a third substrate which is stacked on the second substrate, and in which the second amplification transistor is formed.

(8)

The solid-state imaging device according to (7), in which an electrode of each of the transistors formed in the second substrate and the third substrate includes a silicide.

(9)

An electronic apparatus including:
a solid-state imaging device that outputs a pixel signal corresponding to incident light; and
a signal processing circuit that processes the pixel signal, the solid-state imaging device including
a photoelectric conversion section,
a first signal path including a first floating diffusion and a first amplification transistor,
a second signal path including a second floating diffusion and a second amplification transistor,
a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section,
a first substrate in which at least the photoelectric conversion section is formed, among the photoelectric conversion section, the first floating diffusion, the first amplification transistor, the second floating diffusion, the second amplification transistor, and the mode-switching switch section, and
a second substrate which is stacked on the first substrate, and in which at least the second amplification transistor is formed, among the photoelectric conversion section, the first floating diffusion, the first amplification transistor, the second floating diffusion, the second amplification transistor, and the mode-switching switch section.

(10)

An electronic apparatus including:
a solid-state imaging device that outputs a pixel signal corresponding to incident light; and
a signal processing circuit that processes the pixel signal, the solid-state imaging device including
a photoelectric conversion section,
a first signal path including a first floating diffusion and a first amplification transistor,
a second signal path including a second floating diffusion and a second amplification transistor, a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section, a first substrate in which the photoelectric conversion section and the first floating diffusion are formed, a second substrate which is stacked on the first substrate, and in which the first amplification transistor, the second floating diffusion, and the mode-switching switch section are formed, and a third substrate which is stacked on the second substrate, and in which the second amplification transistor is formed.

According to the solid-state imaging device and the electronic apparatus of a first aspect of the present disclosure as well as the solid-state imaging device and the electronic apparatus of a second aspect of the present disclosure, an amplification transistor to be used is selected depending on the mode, and at least the amplification transistor is formed in a substrate different from a substrate in which the photoelectric conversion section is formed, thus making it possible to achieve both high sensitivity and a high dynamic range even in a high-definition use application. It is to be noted that the effects of the present technology are not necessarily limited to the effects described herein, and may have any of the effects described herein.

This application claims the benefit of Japanese Priority Patent Application JP2018-213147 filed with the Japan Patent Office on Nov. 13, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:
a photoelectric conversion section;
a first signal path including a first floating diffusion, a first amplification transistor, and a first selection transistor;
a second signal path including a second floating diffusion, a second amplification transistor, and a second selection transistor;
a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section;
a first substrate in which the photoelectric conversion section is formed; and
a second substrate which is stacked on the first substrate, and in which the first floating diffusion, the first amplification transistor, the second floating diffusion, the second amplification transistor and the mode-switching switch section are formed,
wherein from a plan view, a length of the first amplification transistor is equal to a length of the second amplification transistor and a width of the second amplification transistor is at least twice a width of the first amplification transistor, and
wherein from the plan view, a length of the first selection transistor is equal to a length of the second selection transistor and a width of the second selection transistor is at least twice a width of the first selection transistor.

2. The solid-state imaging device according to claim 1, wherein an electrode of the first amplification transistor and the second amplification transistor formed in the second substrate includes a silicide.

3. The solid-state imaging device according to claim 1, further comprising a drive circuit that changes a drive current depending on a magnitude of a size of the first amplification transistor or the second amplification transistor that is converted by switching of the mode-switching switch section.

4. The solid-state imaging device according to claim 1, wherein the second substrate includes a wiring layer.

5. The solid-state imaging device according to claim 4, wherein the wiring layer includes a plurality of electrode pads.

6. A solid-state imaging device, comprising:
a photoelectric conversion section;
a first signal path including a first floating diffusion, a first amplification transistor, and a first selection transistor;
a second signal path including a second floating diffusion, a second amplification transistor, and a second selection transistor;
a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section;
a first substrate in which the photoelectric conversion section and the first floating diffusion are formed;
a second substrate which is stacked on the first substrate, and in which the first amplification transistor, the second floating diffusion, and the mode-switching switch section are formed; and
a third substrate which is stacked on the second substrate, and in which the second amplification transistor is formed,
wherein from a plan view, a length of the first amplification transistor is equal to a length of the second amplification transistor and a width of the second amplification transistor is at least twice a width of the first amplification transistor, and
wherein from the plan view, a length of the first selection transistor is equal to a length of the second selection transistor and a width of the second selection transistor is at least twice a width of the first selection transistor.

7. The solid-state imaging device according to claim 6, wherein an electrode of each of the first amplification transistor or second amplification transistor formed in the second substrate and the third substrate includes a silicide.

8. The solid-state imaging device according to claim 6, further comprising a drive circuit that changes a drive current depending on a magnitude of a size of the first amplification transistor or the second amplification transistor that is converted by switching of the mode-switching switch section.

9. The solid-state imaging device according to claim 6, wherein the second substrate includes a wiring layer.

10. The solid-state imaging device according to claim 9, wherein the wiring layer includes a plurality of electrode pads.

11. An electronic apparatus, comprising:
a solid-state imaging device that outputs a pixel signal corresponding to incident light; and a signal processing circuit that processes the pixel signal, wherein the solid-state imaging device includes:
a photoelectric conversion section;
a first signal path including a first floating diffusion, a first amplification transistor, and a first selection transistor;
a second signal path including a second floating diffusion, a second amplification transistor, and a second selection transistor;
a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section;
a first substrate in which the photoelectric conversion section is formed; and
a second substrate which is stacked on the first substrate, and in which the first floating diffusion, the first amplification transistor, the second floating diffusion, the second amplification transistor and the mode-switching switch section are formed,
wherein from a plan view, a length of the first amplification transistor is equal to a length of the second amplification transistor and a width of the second amplification transistor is at least twice a width of the first amplification transistor, and
wherein from the plan view, a length of the first selection transistor is equal to a length of the second selection transistor and a width of the second selection transistor is at least twice a width of the first selection transistor.

12. The electronic apparatus according to claim 11, wherein an electrode of the first amplification transistor and the second amplification transistor formed in the second substrate includes a silicide.

13. The electronic apparatus according to claim 11, further comprising a drive circuit that changes a drive current depending on a magnitude of a size of the first amplification transistor or the second amplification transistor that is converted by switching of the mode-switching switch section.

14. The electronic apparatus according to claim 11, wherein the second substrate includes a wiring layer.

15. The electronic apparatus according to claim 14, wherein the wiring layer includes a plurality of electrode pads.

16. An electronic apparatus, comprising:
a solid-state imaging device that outputs a pixel signal corresponding to incident light; and
a signal processing circuit that processes the pixel signal, wherein the solid-state imaging device includes:
a photoelectric conversion section;
a first signal path including a first floating diffusion, a first amplification transistor, and a first selection transistor;
a second signal path including a second floating diffusion, a second amplification transistor, and a second selection transistor;
a mode-switching switch section that, in a first mode, electrically couples the first signal path to the photoelectric conversion section and electrically decouples the second signal path from the photoelectric conversion section, and that, in a second mode, electrically couples both of the first signal path and the second signal path to the photoelectric conversion section;
a first substrate in which the photoelectric conversion section and the first floating diffusion are formed;
a second substrate which is stacked on the first substrate, and in which the first amplification transistor, the second floating diffusion, and the mode-switching switch section are formed; and
a third substrate which is stacked on the second substrate, and in which the second amplification transistor is formed,
wherein from a plan view, a length of the first amplification transistor is equal to a length of the second amplification transistor and a width of the second amplification transistor is at least twice a width of the first amplification transistor, and
wherein from the plan view, a length of the first selection transistor is equal to a length of the second selection transistor and a width of the second selection transistor is at least twice a width of the first selection transistor.

17. The electronic apparatus according to claim 16, wherein an electrode of each of the first amplification transistor or second amplification transistor formed in the second substrate and the third substrate includes a silicide.

18. The electronic apparatus according to claim 17, further comprising a drive circuit that changes a drive current depending on magnitude of a size of the first amplification transistor or the second amplification transistor that is converted by switching of the mode-switching switch section.

19. The electronic apparatus according to claim 16, wherein the second substrate includes a wiring layer.

20. The electronic apparatus according to claim 19, wherein the wiring layer includes a plurality of electrode pads.

* * * * *